United States Patent
Yamazaki et al.

(10) Patent No.: US 6,633,072 B2
(45) Date of Patent: Oct. 14, 2003

(54) FABRICATION METHOD FOR SEMICONDUCTOR INTEGRATED CIRCUIT DEVICES AND SEMICONDUCTOR INTEGRATED CIRCUIT DEVICE

(75) Inventors: Kazuo Yamazaki, Kokubunji (JP); Shinji Kuniyoshi, Tokyo (JP); Kousuke Kusakari, Hitachinaka (JP); Takenobu Ikeda, Ome (JP); Masahiro Tadokoro, Hachiouji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/811,589

(22) Filed: Mar. 20, 2001

(65) Prior Publication Data

US 2001/0028093 A1 Oct. 11, 2001

Related U.S. Application Data

(62) Division of application No. 09/810,577, filed on Mar. 19, 2001, now Pat. No. 6,479,392.

(30) Foreign Application Priority Data

Mar. 30, 2000 (JP) ........................................ 2000-094986

(51) Int. Cl.$^7$ ............................................. H01L 29/78
(52) U.S. Cl. ......................................... 257/401; 438/475
(58) Field of Search ........................... 257/401; 438/475, 438/488, 483

(56) References Cited

U.S. PATENT DOCUMENTS

| 6,200,866 | B1 | * | 3/2001 | Ma et al. |
| 6,319,840 | B1 | * | 11/2001 | Costrini et al. |
| 6,335,266 | B1 | * | 1/2002 | Kitahara et al. |
| 6,344,383 | B1 | * | 2/2002 | Berry et al. |
| 6,348,420 | B1 | * | 2/2002 | Raaijmakers et al. |

FOREIGN PATENT DOCUMENTS

| FR | 2805924 A1 | * | 9/2001 |
| JP | 11330463 | * | 11/1999 |

OTHER PUBLICATIONS

Polysilicon–Germanium Gate Patterning Studies in a High Density Plasma Helicon Source, 1997 American Vacuum Society, pp. 1874–1880.*

Germanium Etching in High Density Plasmas for 0.18 PM Complementary Metal Oxide Semiconductor Gate Patterning Applications, 1998 American Vacuum Society, pp. 1833–1840.*

* cited by examiner

*Primary Examiner*—Stephen D. Meier
(74) *Attorney, Agent, or Firm*—Antonelli, Terry, Stout & Kraus, LLP

(57) ABSTRACT

To improve the shape of a gate electrode having SiGe, after patterning a gate electrode 15G having an SiGe layer 15b by a dry etching process, a plasma processing (postprocessing) is carried out in an atmosphere of an Ar/CHF$_3$ gas. Thereby, the gate electrode 15G can be formed without causing side etching at two side faces (SiGe layer 15b) of the gate electrode 15G.

4 Claims, 21 Drawing Sheets

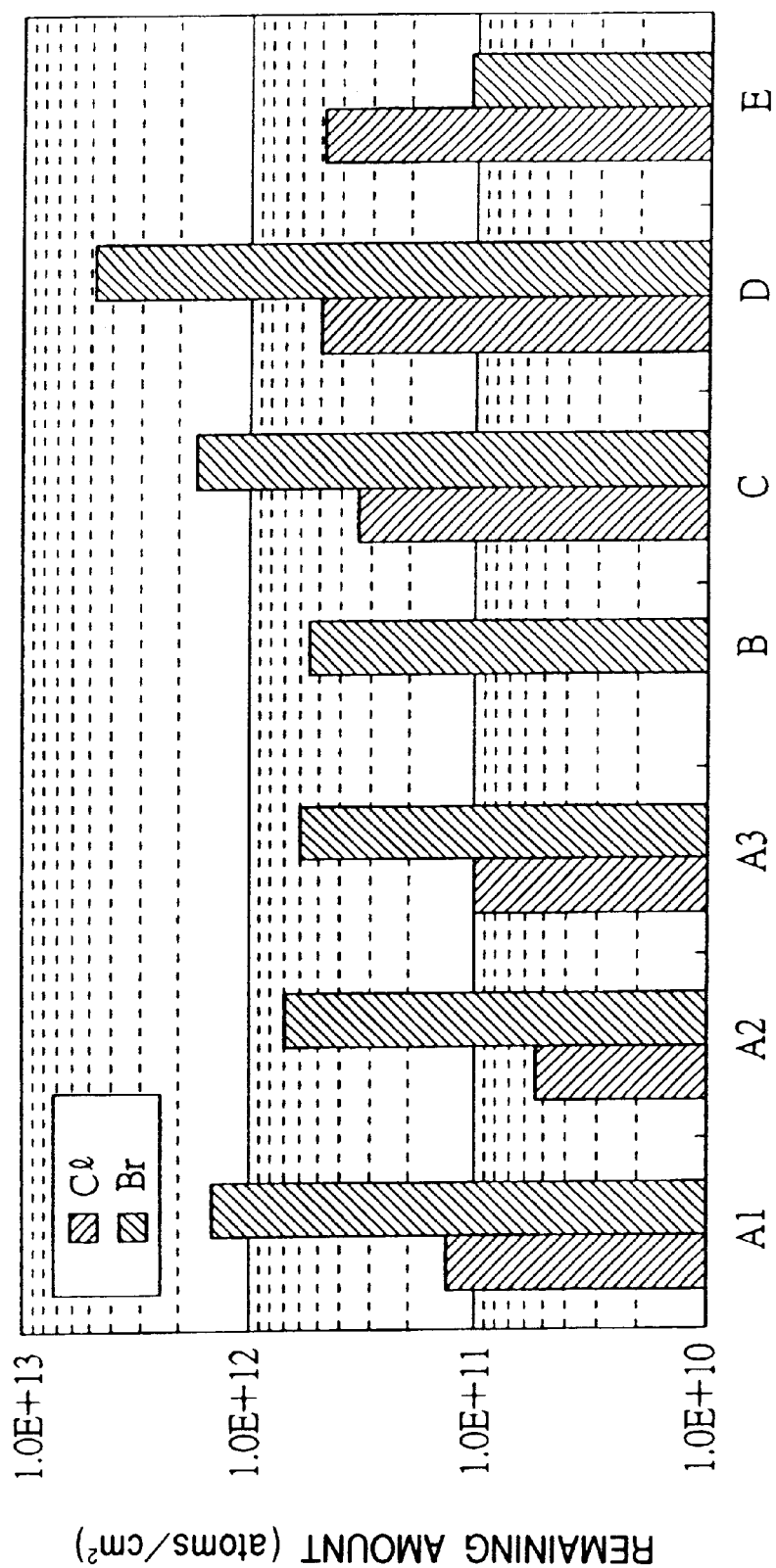

US 6,633,072 B2

FABRICATION METHOD FOR SEMICONDUCTOR INTEGRATED CIRCUIT DEVICES AND SEMICONDUCTOR INTEGRATED CIRCUIT DEVICE

This application is a divisional application of U.S. Ser. No. 09/810,577, filed Mar. 19, 2001 now U.S. Pat. No. 6,479,392.

BACKGROUND OF THE INVENTION

The present invention relates to a method of fabrication of semiconductor integrated circuit devices and to a semiconductor integrated circuit device, particularly to a fabrication method and a semiconductor integrated circuit device having an alloy of silicon (Si) and germanium (Ge) (hereinafter, simply referred to as SiGe) of polycrystal or single crystal.

With regard to a semiconductor integrated circuit device using SiGe for a gate electrode material, there are descriptions in, for example, J. Vac. Sci. Technol July/August 1997 pl874 through pi880, J. Vac. Sci. Technol July/August 1998 pl833 through pl840 and Japanese Patent Laid-open No. 330463/1999, disclosing a technique for patterning an SiGe gate electrode.

SUMMARY OF THE INVENTION

A description will be given of a result of an investigation by the present inventors of a technology for forming a gate electrode having an SiGe layer.

A process of forming a gate electrode having an SiGe layer includes three processing steps, including depositing a gate electrode forming film, patterning the film and postprocessing the patterned film. That is, first, after forming a gate insulating film over a main surface of a semiconductor substrate, a gate electrode forming film having an SiGe layer is deposited thereabove. Successively, after forming a photoresist pattern over the gate electrode forming film, a gate electrode having the SiGe layer is formed by patterning the gate electrode forming film with an etching gas including, for example, chlorine ($Cl_2$) and bromine (Br), using the photoresist pattern as an etching mask Thereafter, in order to remove Cl, Br and reaction products thereof and reaction products including Si which have adhered to a surface of the semiconductor substrate in forming the gate electrode (hereinafter also referred to as adhered matter), a plasma processing is carried out on the semiconductor substrate in an atmosphere of a predetermined gas (postprocessing).

The postprocessing is a processing which is also carried out after forming the gate electrode by patterning polycrystal silicon; and, when the postprocessing is not carried out, there is a rawback, for example, as follows. That is, when the reaction products are not removed, due to the presence of this foreign matter, the reliability or yield of the semiconductor integrated circuit device is deteriorated. When adhered matter is present on a main face of another semiconductor substrate before patterning the gate electrode, in patterning the gate electrode of the other semiconductor substrate, the adhered matter operates as a mask, and there is produced an etching residue of a gate electrode material. Further, when Cr or Br adhered to the surface of the semiconductor, substrate is not removed, parts of the semiconductor fabricating apparatus are corroded by Cl or Br. Further, Cl or Br is toxic, and, therefore, adverse influence is effected on the human body.

With regard to the gas used in the postprocessing, when SiGe is used as the gate electrode material, there is used, for example, $O_2/CHF_3$ since a stable electricity discharge range is provided thereby. Further, this gas is generally used in the postprocessing when polycrystal silicon, is used as the gate electrode material, since an amount of data is enormous and introduction thereof is facilitated. This is similar to the postprocessing when the polycrystal silicon is used as a gate electrode material.

However, according to the technology of forming the gate electrode having an SiGe layer, it has been found for the first time by experiment and evaluation of the inventors that the following problem exists. That is, there is a problem in that so-to-speak side etching is caused in which two side faces of the SiGe layer portion in the gate electrode are polished toward the center.

First, when the inventors evaluated the performance of etching SiGe, it was found that the side etching is liable to occur. Hence, when evaluation had been carried out further in detail, it was found that, although the side etching is not caused in the processing in the etching chamber, the side etching is caused when the postprocessing is carried out in a post processing chamber. Further, it was found that the presence or absence of occurrence of the side etching is dependent upon the concentration of Ge. Further, the shape of the side etching was not improved even after investigating a reduction in the concentration of $CHF_3$, or a reduction in electricity discharge power during postprocessing.

It is an object of the invention to provide a technology capable of improving the shape of a gate electrode having SiGe.

It is other object of the invention to provide a technology capable of promoting the accuracy of dimensions of fabricating a gate electrode having SiGe.

Further, it is another object of the invention to provide a technology capable of promoting the yield of a semiconductor integrated circuit device having a gate electrode having SiGe.

Further, it is a further object of the invention to provide a technology capable of promoting the function of a semiconductor integrated circuit having a gate electrode having SiGe.

Further, it is still another object of the invention to provide a technology capable of simplifying the fabrication steps in the manufacture of a semiconductor integrated circuit device having a gate electrode having SiGe.

Further, it is a still further other object of the invention to provide a technology capable of shortening the development and fabrication time period of a semiconductor integrated circuit device having a gate electrode having SiGe.

The above-described and other objects and novel characteristics of the invention will become apparent from description provided in this specification and the attached drawings.

A simple explanation will be given of an outline of representative aspects of the invention disclosed in the application as follows.

That is, according to an aspect of the invention, there are provided steps of forming a gate electrode having an SiGe layer over a semiconductor substrate by patterning a gate electrode forming film having the SiGe layer and thereafter subjecting the semiconductor substrate to a plasma processing in an atmosphere of a mixed gas of a first gas hardly reactive to Ge and a second gas having a function of etching Si.

Further, according to another aspect of the invention, there are provided steps of forming a gate electrode over a semiconductor substrate by patterning a gate electrode forming film deposited on the semiconductor substrate and thereafter subjecting the semiconductor substrate to a plasma processing in an atmosphere of a mixed gas of a first gas hardly reactive, to Ge and a second gas having a function of etching Si; wherein, and the step of depositing the gate electrode forming film includes a step of depositing an SiGe layer and a step of depositing a polycrystal silicon layer at a layer above the SiGe layer.

Further, according to another aspect of the invention, there are further provided, after the plasma processing, a step of forming side wall insulating films at side faces of the gate electrode, a step of exposing an upper face of the gate electrode and portions of a main face of the semiconductor substrate, a step of depositing a metal film having a high melting point over the semiconductor substrate and a step of forming a metal silicide layer having a high melting point at the upper face of the gate electrode and the portions of the main face of the semiconductor substrate.

Further, according to another aspect of the invention, the metal silicide layer having a high melting point is made of cobalt silicide.

Further, according to another aspect of the invention, there are provided steps of forming a gate electrode over a semiconductor substrate by patterning a gate electrode forming film deposited over the semiconductor substrate and thereafter subjecting the semiconductor substrate to a plasma processing in an atmosphere of a mixed gas of a first gas hardly reactive to Ge and a second gas having a function of etching Si; wherein, the step of depositing the gate electrode forming film includes a step of depositing an SiGe layer and a step of depositing a metal layer at a layer above the SiGe layer.

Further, according to another aspect of the invention, there is provided a step of introducing boron to the SiGe layer.

Further, according to another aspect of the invention, the first gas is constituted by an inert gas.

Further, according to another aspect of the invention, the first gas is constituted by Ar, He, Kr or Xe.

Further, according to another aspect of the invention, the first gas is constituted by nitrogen gas.

Further, according to another aspect of the invention, the second gas is constituted by a gas including fluorine.

Further, according to another aspect of the invention, the second gas is constituted by $CHF_3$, $CF_4$, $C_2F_6$ or $SF_6$.

Further, according to another aspect of the invention, when the first gas is constituted by Ar gas, and pressure in the atmosphere is made equal to or smaller than 70 Pa.

Further, according to another aspect of the invention, when the first gas is constituted by Ar gas, the microwave power for forming a plasma is 750 W.

Further, according to another aspect of the invention, when the first gas is constituted by Ar gas and the second gas is constituted by $CHF_3$, the concentration of the second gas is made equal to or smaller than 5% of the total.

Further, according to another aspect of the invention, when the gate electrode forming film having the SiGe layer is patterned, there is carried out a plasma etching processing in an atmosphere of chlorine, bromine or a mixed gas thereof.

Further, according to another aspect of the invention, the concentration of Ge of the SiGe layer is equal to or larger than 10% of the total.

Further, according to another aspect of the invention, the concentration of Ge of the SiGe layer is equal to or larger than 20% of the total.

Further, according to another aspect of the invention, the concentration of Ge of the SiGe layer is equal to or larger than 40% of the total.

Further, according to another aspect of the invention, there is further provided a step of fabricating a semiconductor integrated circuit device in which the semiconductor substrate, after the step of patterning the gate electrode, is transferred to the plasma processing step while maintaining a vacuum state.

Further, according to another aspect of the invention, the side etching amount at two side faces of the gate electrode after the plasma processing is equal to or smaller than 40% of the length in a channel length direction of the gate electrode at a portion thereof other than the SiGe layer.

Further, according to another aspect of the invention, the length in the channel direction of the gate electrode at the SiGe layer, after the plasma processing, is equal to the length in the channel length direction of the gate electrode at the portion other than the SiGe layer.

Further, according to another aspect of the invention, there is a gate electrode of an n-channel type field effect transistor or a p-channel type field effect transistor formed on the same semiconductor substrate for the gate electrode.

Figure 9A:
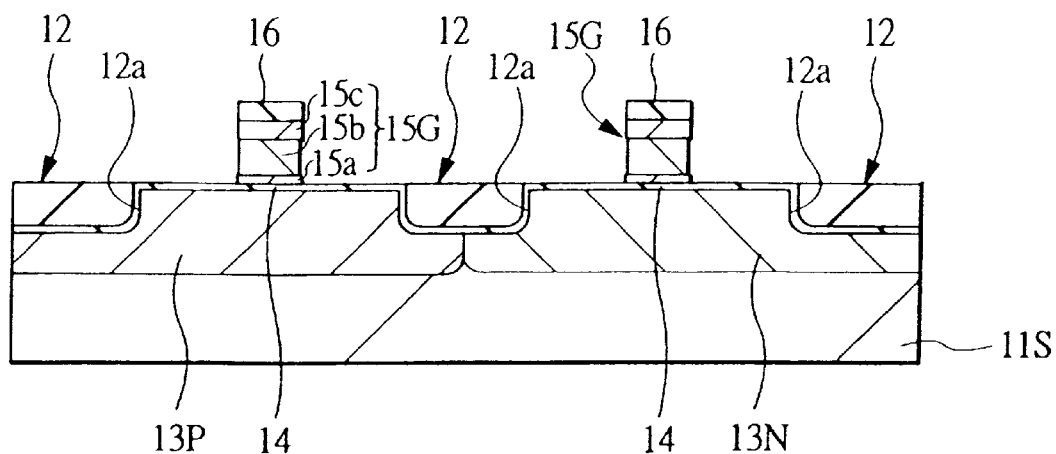
FIG. 9(a) is a sectional view of essential portions in a fabrication step of the semiconductor integrated circuit device subsequent to the step shown in FIG. 7(a), and FIG.
Figure 11A:
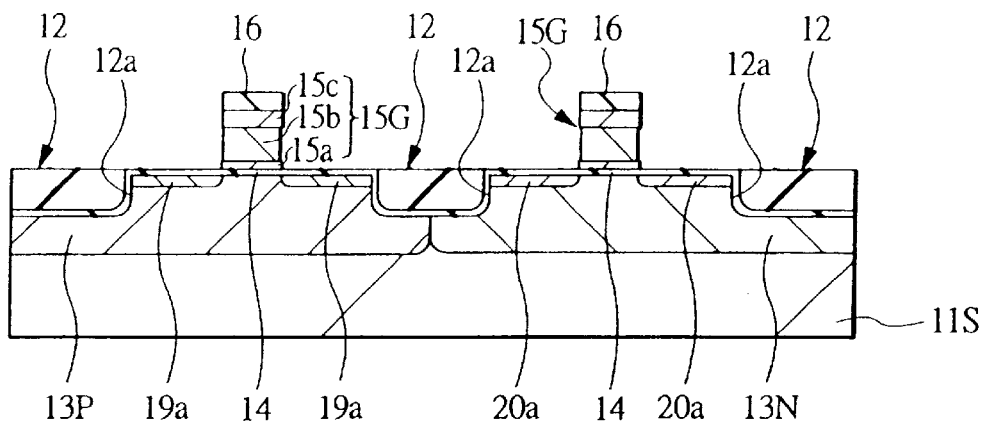
Figure 11B:
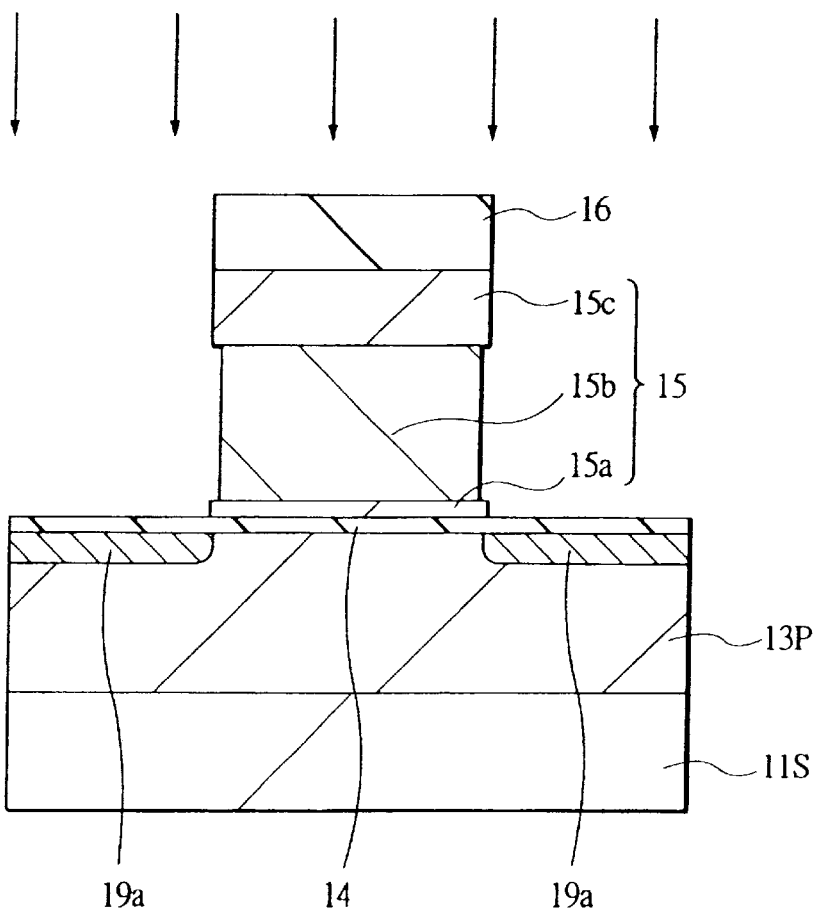
Figure 12A:
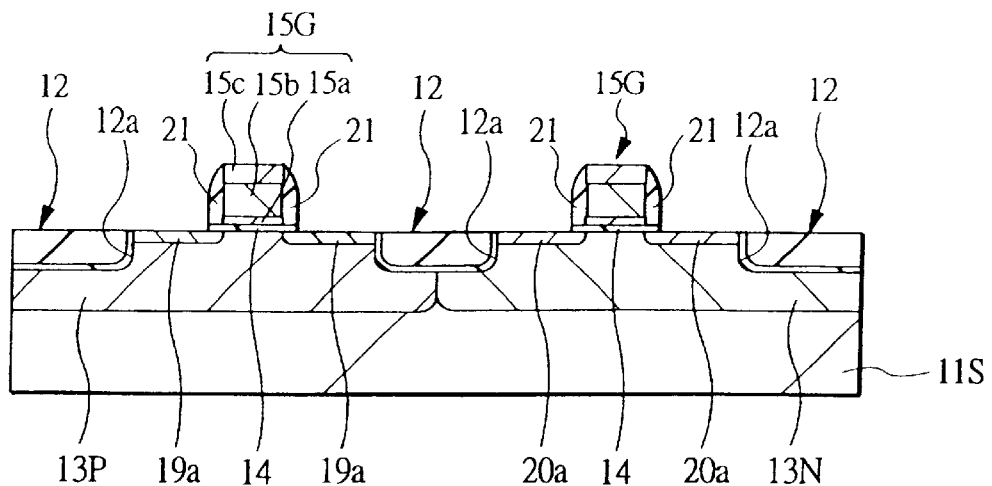
Figure 12B:
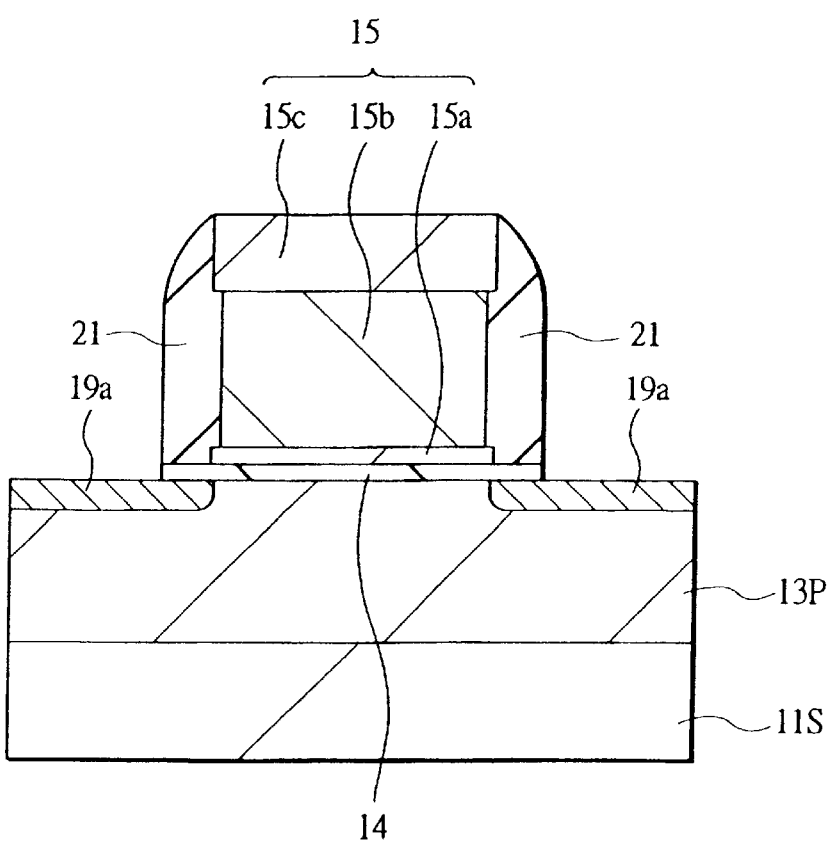
Figure 13A:
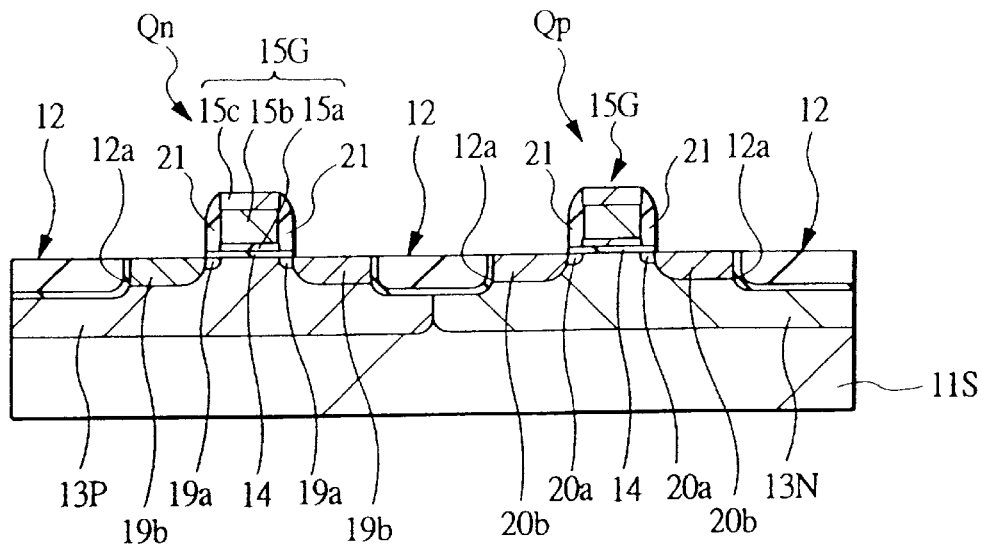
Figure 13B:
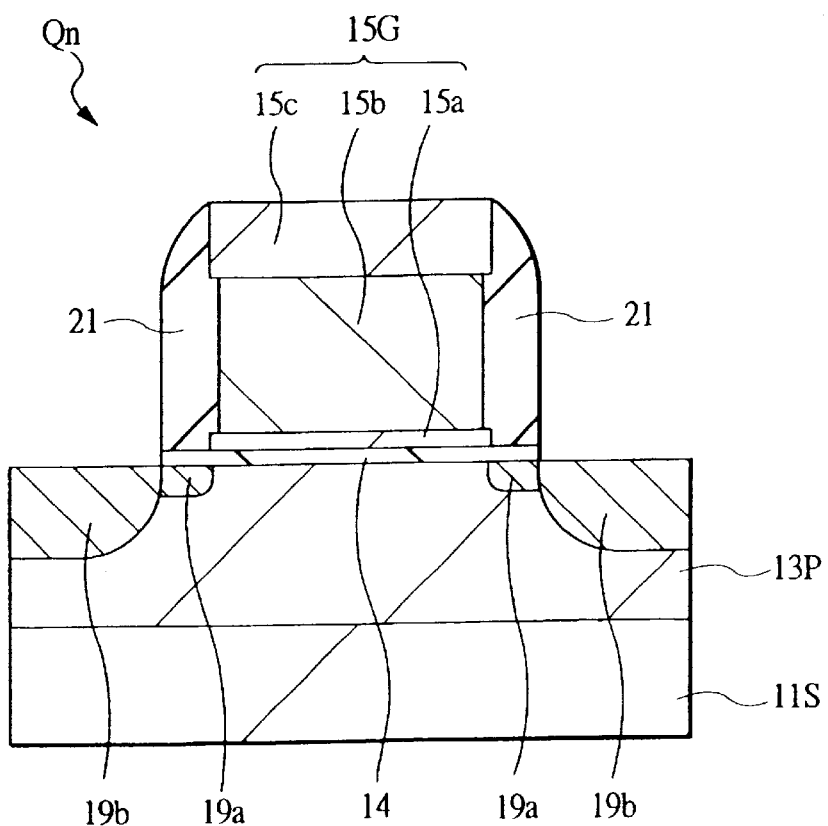
Figure 14A:
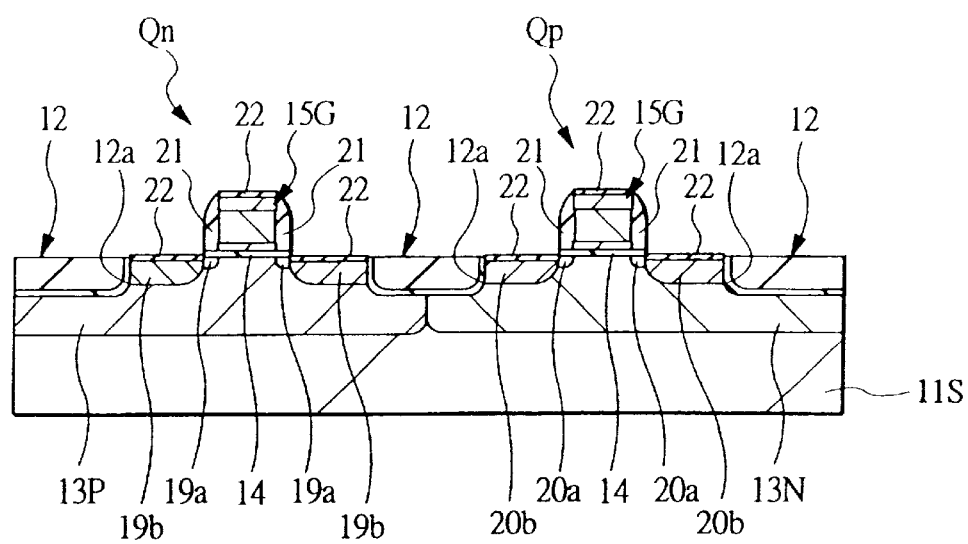
Figure 14B:
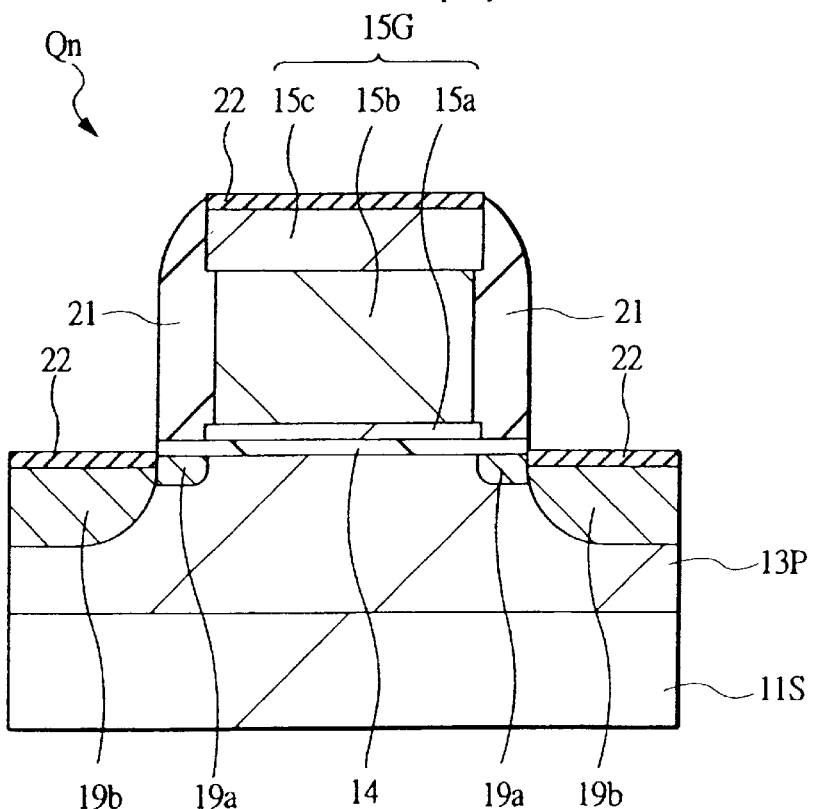
Figure 15:
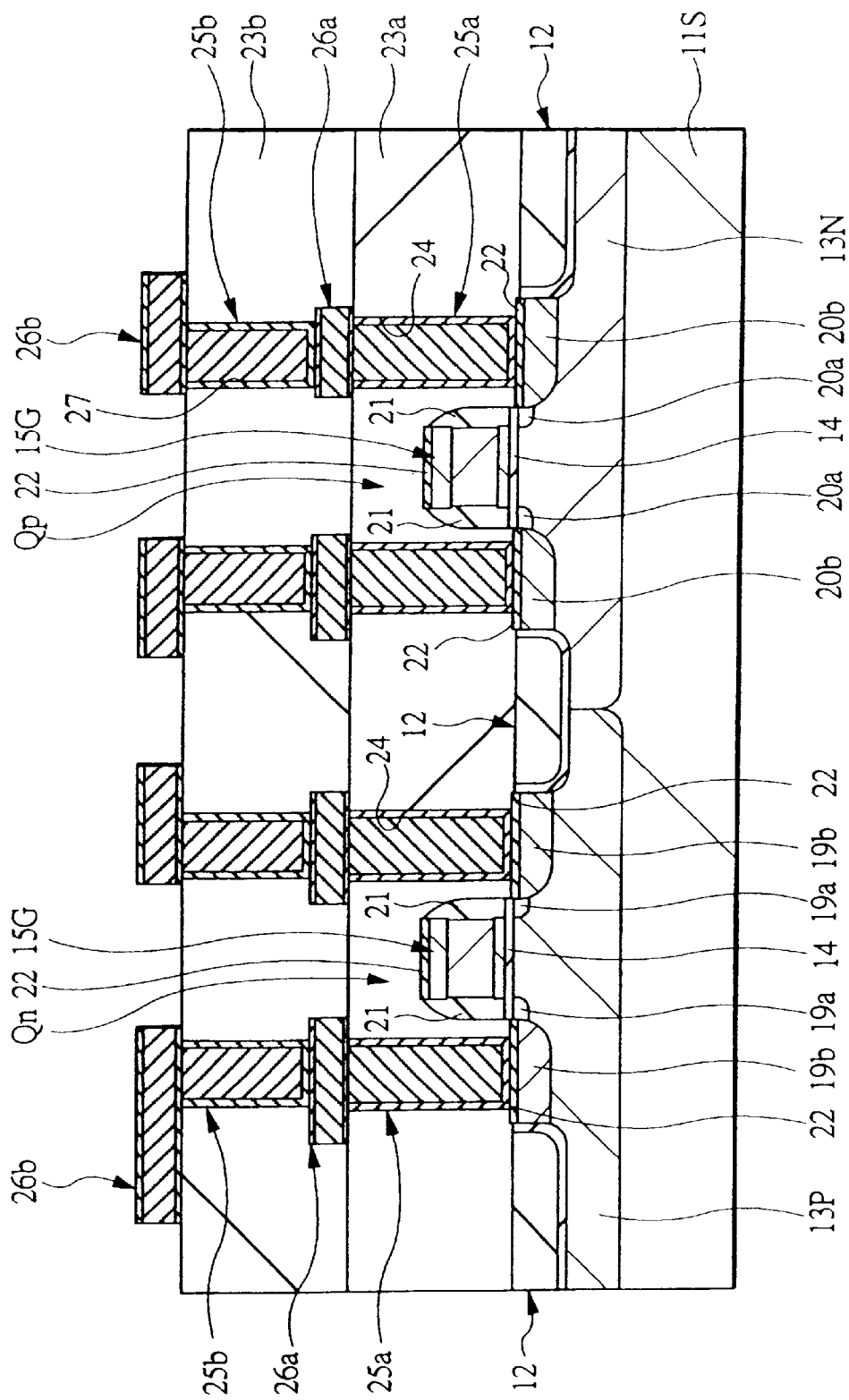
Figure 16A:
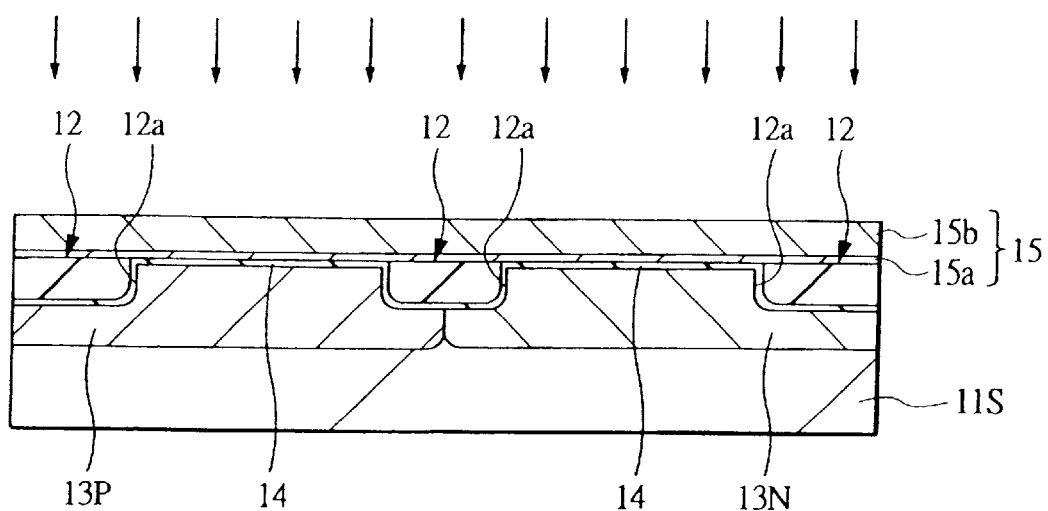
Figure 16B:
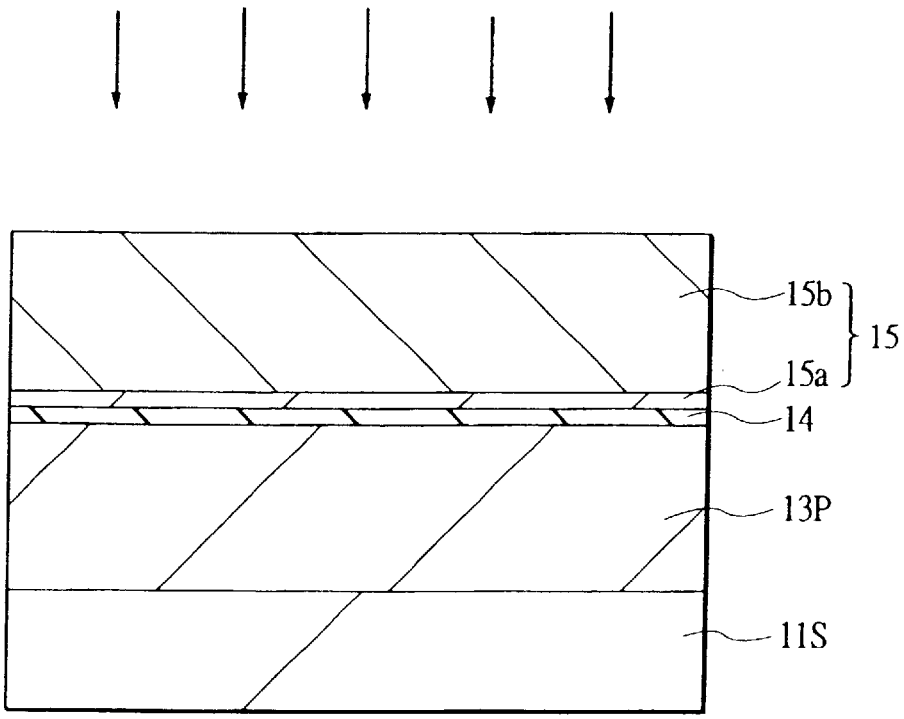
Figure 17A:
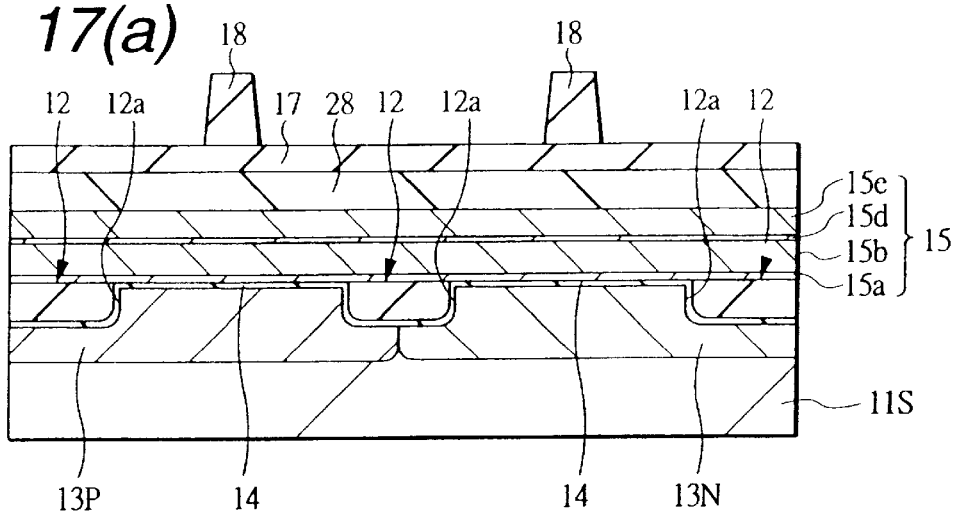
Figure 17B:
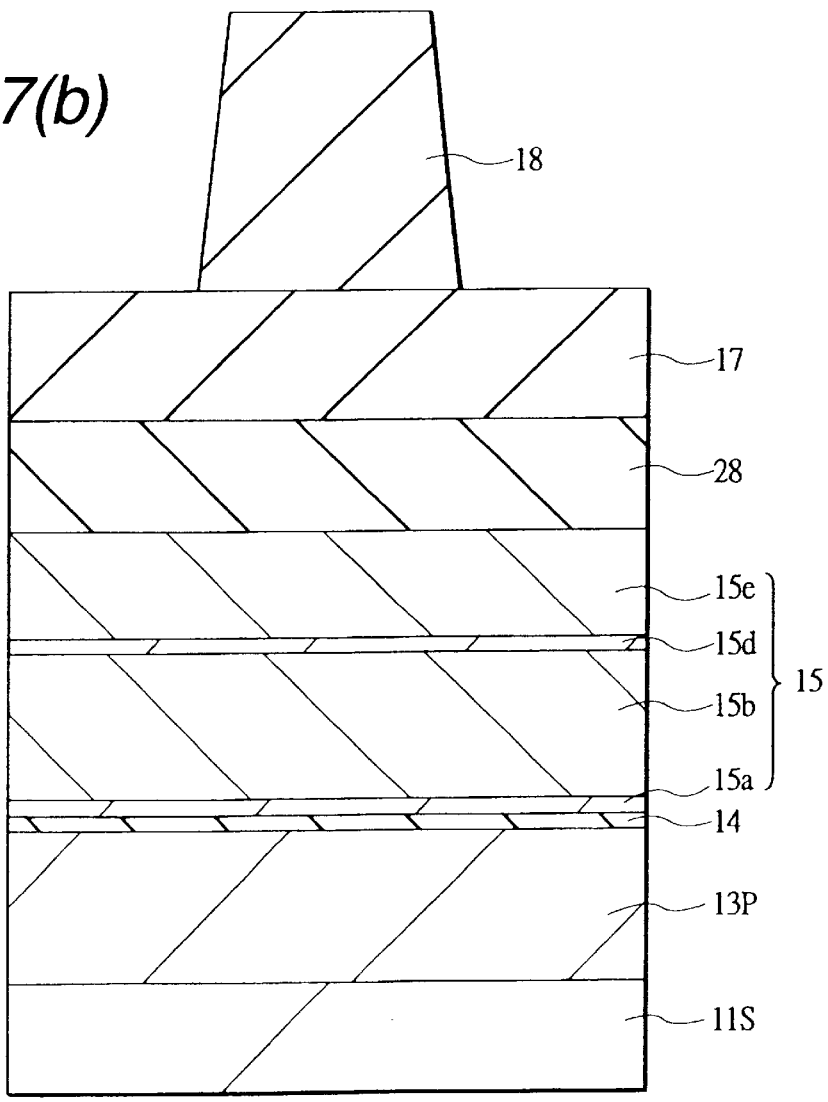
Figure 18A:
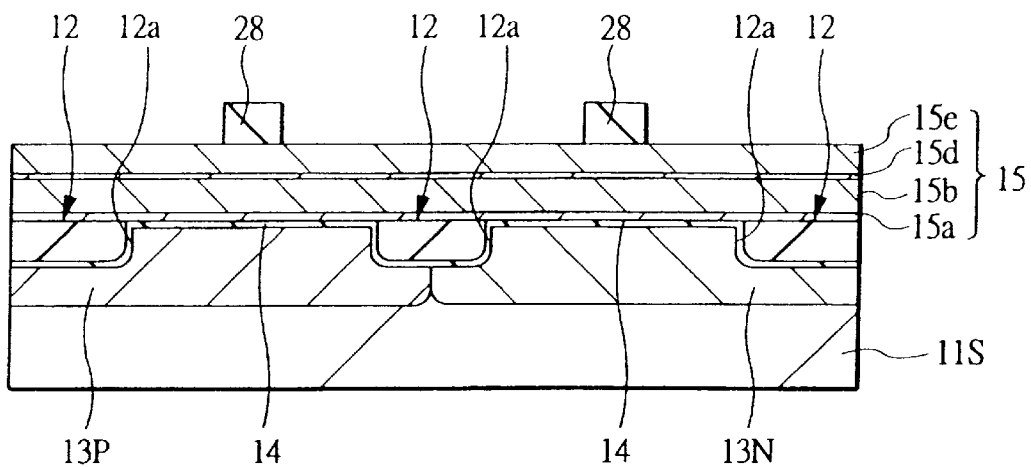
Figure 18B:
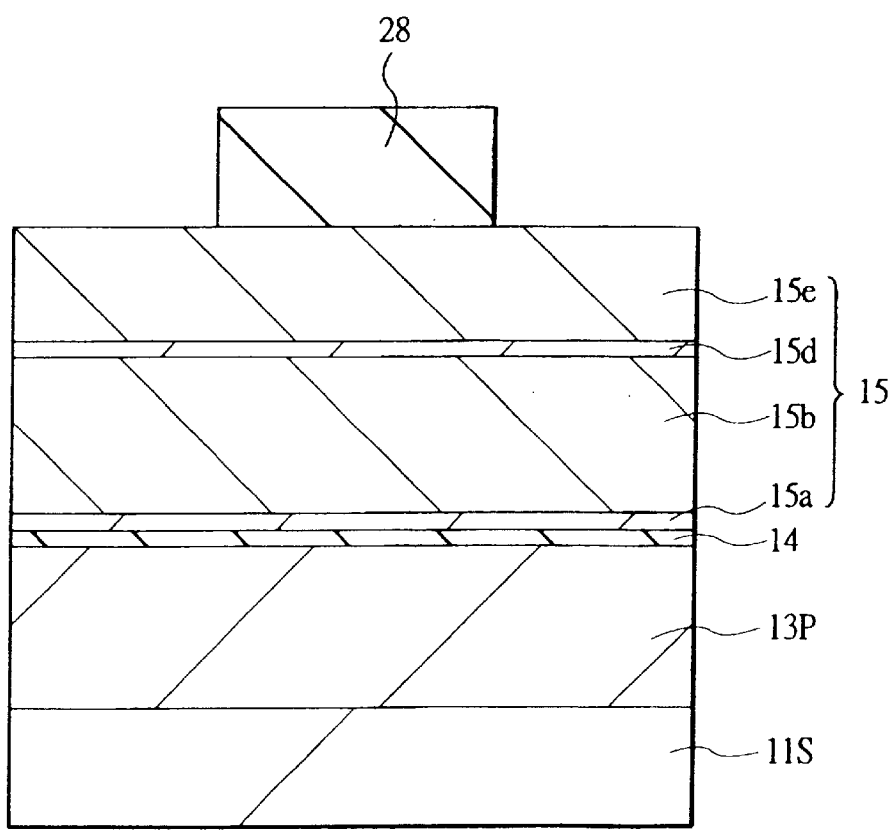
Figure 19A:
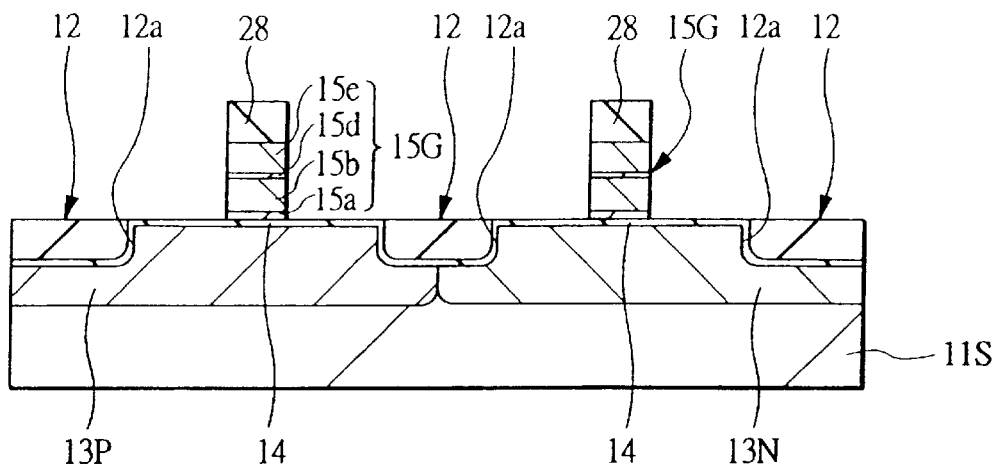
Figure 19B:
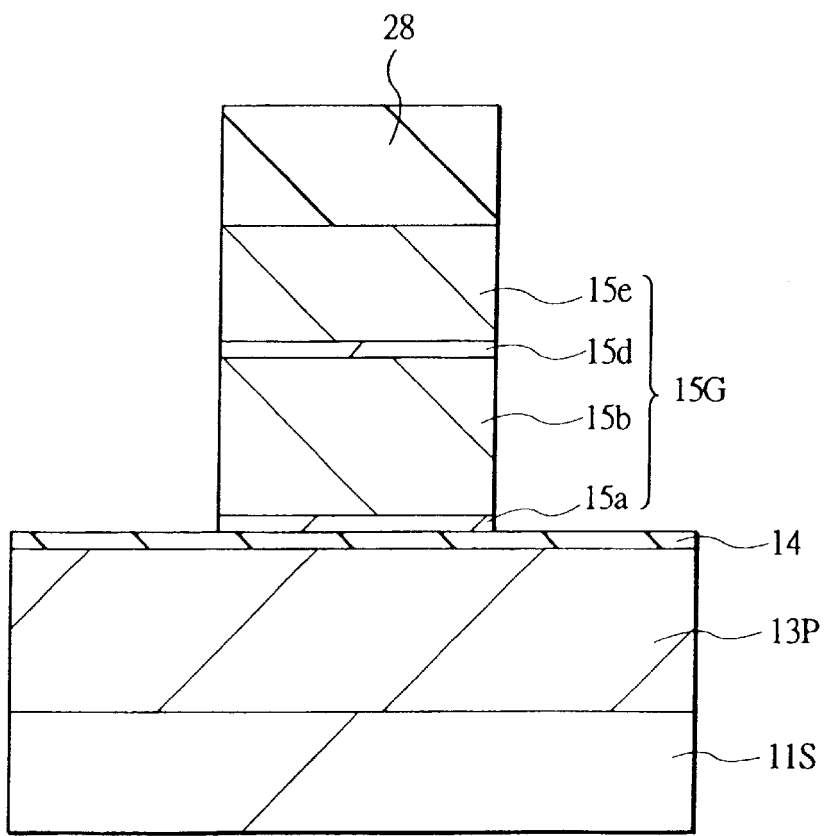
Figure 20A:
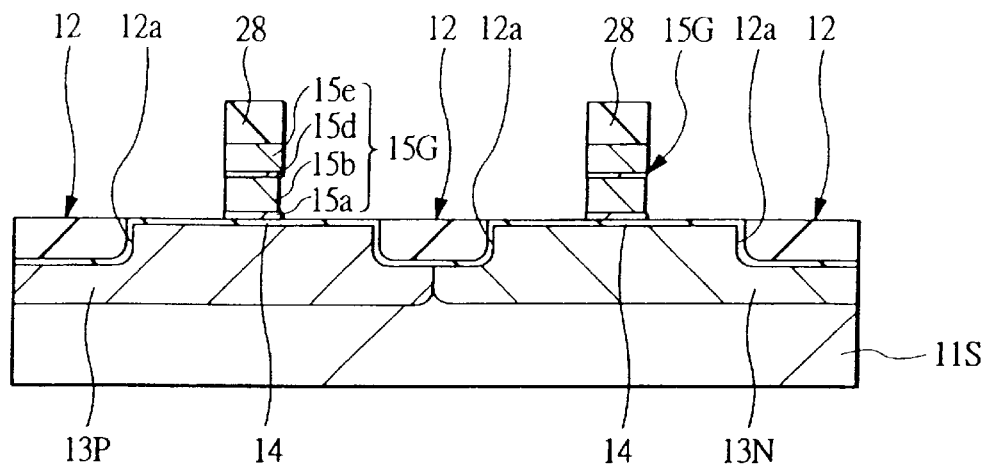
Figure 20B:
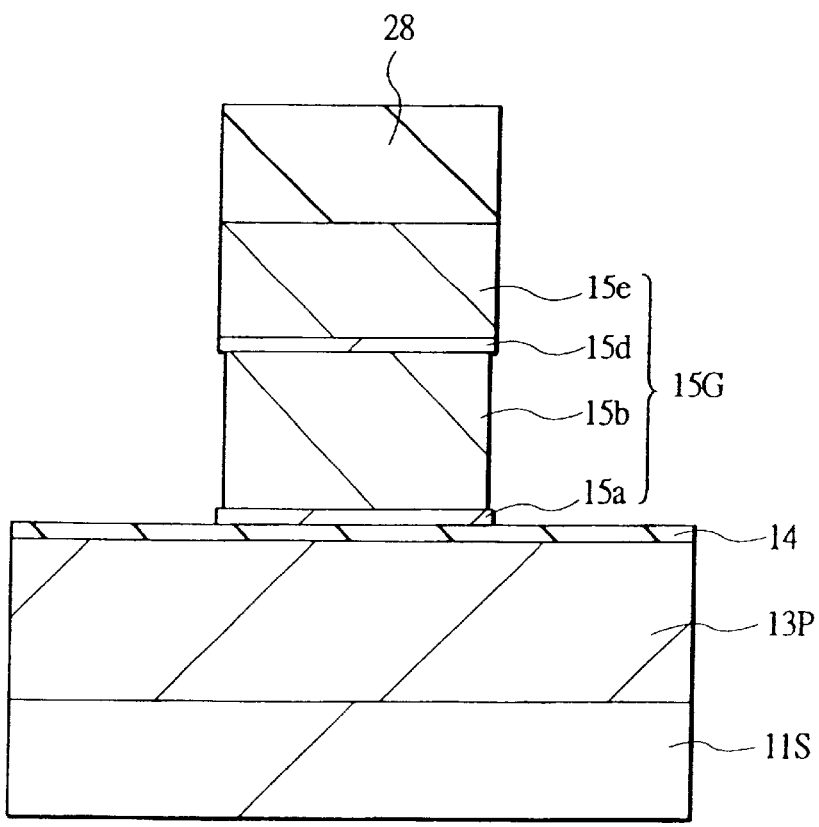
Figure 21A:
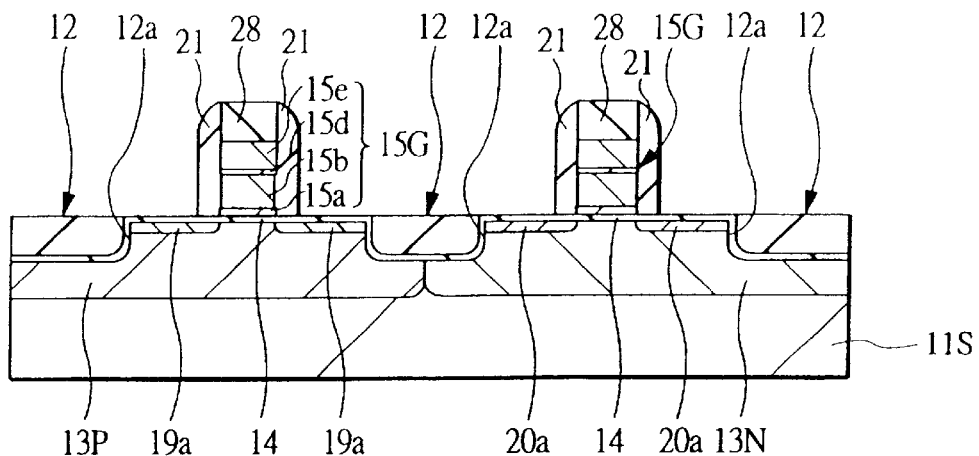
Figure 21B:
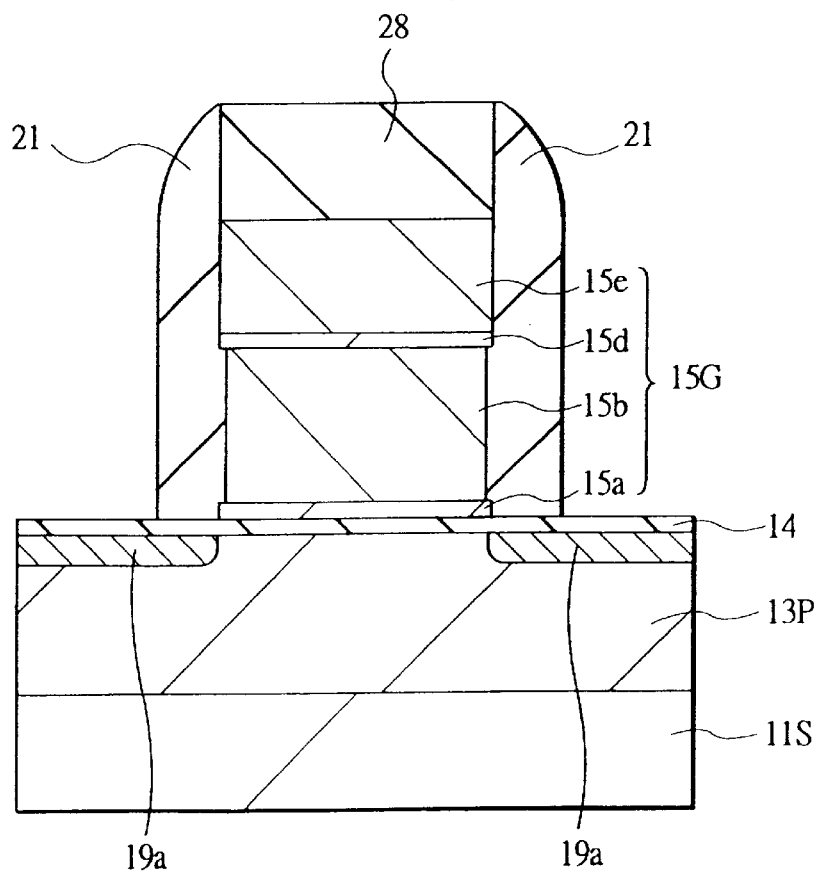
Figure 22A:
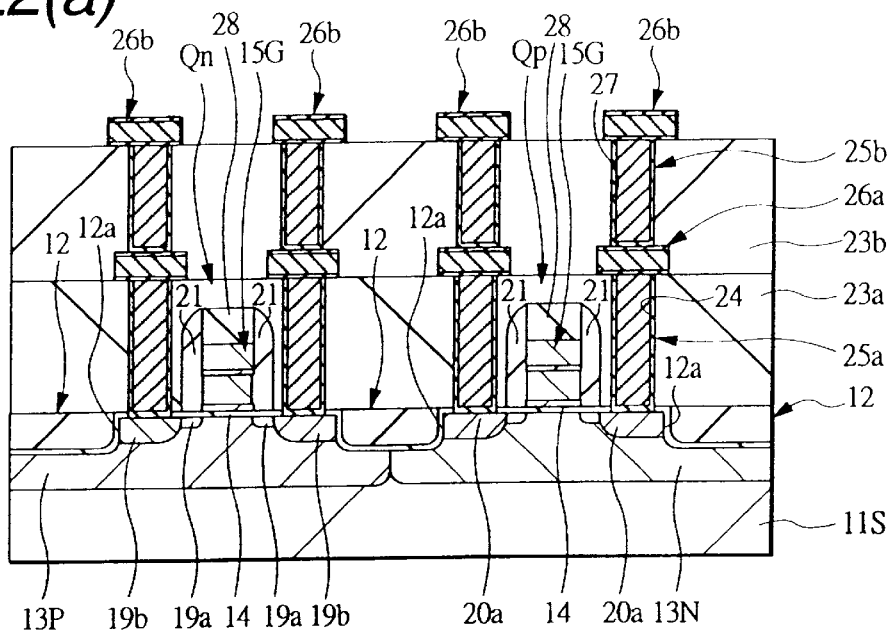
Figure 22B:
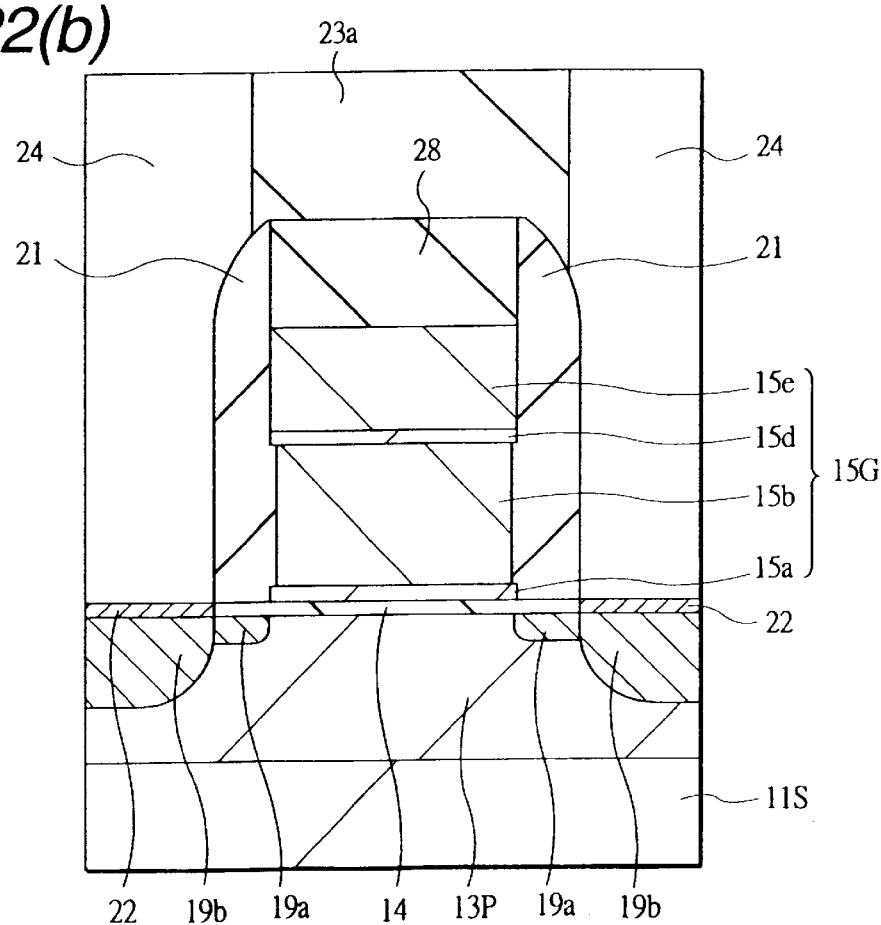

9(b) is a sectional view enlarging essential portions of an area in which the n-channel type MISFET is shown in FIG. 9(a);

FIG. 10 is a graph showing a result of investigating whether Cl, Br or the like, which has adhered to the semiconductor substrate, has been removed by the postprocessing of the invention by total reflection type fluorescent X-ray processing;

FIG. 11(a) is a sectional view of essential portions in a fabrication step of the semiconductor integrated circuit device subsequent to the step shown in FIG. 9(a), and FIG. 11(b) is a sectional view enlarging essential portions of an area in which the n-channel type MISFET is shown in FIG. 11(a);

FIG. 12(a) is a sectional view of essential portions in a fabrication step of the semiconductor integrated circuit device subsequent to the step shown in FIG. 11(a), and FIG. 12(b) is a sectional view enlarging essential portions of an area in which the n-channel type MISFET is shown in FIG. 12(a);

FIG. 13(a) is a sectional view of essential portions in a fabrication step of the semiconductor integrated circuit device subsequent to the step shown in FIG. 12(a), and FIG. 13(b) is a sectional view enlarging essential portions of an area in which the n-channel type MISFET is shown in FIG. 13(a);

FIG. 14(a) is a sectional view of essential portions in a fabrication step of the semiconductor integrated circuit device subsequent to the step shown in FIG. 13(a), and FIG. 14(b) is a sectional view enlarging essential portions of an area in which the n-channel type NISFET is shown in FIG. 14(a);

FIG. 15 is a sectional view of essential portions in a fabrication step of the semiconductor integrated circuit device subsequent to the step shown in FIG. 14(a);

FIG. 16(a) is a sectional view of essential portions in a fabrication step of a semiconductor integrated circuit device according to other embodiment of the invention, and FIG. 16(b) is a sectional view enlarging essential portions of an area in which the n-channel type MISFET the step shown in FIG. 16(a);

FIG. 17(a) is a sectional view of essential portions in a fabrication step of the semiconductor integrated circuit device subsequent to the step shown in FIG. 16(a), and FIG. 17(b) is a sectional view enlarging essential portions of an area in which the n-channel type MISFET is shown in FIG. 17(a);

FIG. 18(a) is a sectional view of essential portions in a fabrication step of the semiconductor integrated circuit device subsequent to the step shown in FIG. 17(a), and FIG. 18(b) is a sectional view enlarging essential portions of an area in which the n-channel type MISFET is shown in FIG. 18(a);

FIG. 19(a) is a sectional view of essential portions in a fabrication step of the semiconductor integrated circuit device subsequent to the step shown in FIG. 18(a), and FIG. 19(b) is a sectional view enlarging essential portions of an area in which the n-channel type MISFET is shown in FIG. 19(a);

FIG. 20(a) is a sectional view of essential portions in a fabrication step of the semiconductor integrated circuit device subsequent to the step shown in FIG. 19(a), and FIG. 20(b) is a sectional view enlarging essential portions of an area in which the n-channel type MISFET is shown in FIG. 20(a);

FIG. 21(a) is a sectional view of essential portions in a fabrication step of the semiconductor integrated circuit device subsequent to the step shown in FIG. 20(a), and FIG. 21(b) is a sectional view enlarging essential portions of an area in which the n-channel type MISFET is shown in FIG. 21(a); and FIG. 22(a) is a sectional view of essential portions in a fabrication step of the semiconductor integrated circuit device subsequent to the step shown in FIG. 21(a), and FIG. 22(b) is a sectional view enlarging essential portions of an area in which the n-channel type MISFET is shown in FIG. 22(a).

DETAILED DESCRIPTION OF THE PREFERRED EMBODIMENTS

In the following description of the embodiments of the invention, a semiconductor wafer (semiconductor substrate) refers to a silicon single crystal substrate (generally, substantially in a planer circle shape) used in the fabrication of a semiconductor integrated circuit, a sapphire substrate, a glass substrate, other insulating, noninsulating or semiconductor substrates, as well as a substrate formed of a composite of these. Further, in this specification, a semiconductor device includes a semiconductor device formed on a semiconductor or an insulating substrate, such as a silicon wafer or a sapphire substrate, as well as a semiconductor device formed on another insulating substrate of glass or the like, such as TFT (Thin-Film-Transistor) and STN (Super-Twisted Nematic) liquid crystal, except when particularly specified otherwise.

Although in the following description of the embodiments, as necessary for convenience, an explanation will be given of the following embodiments divided into a plurality of sections or embodiments, and, except when particularly specified, these are not unrelated to each other, but one of them is under a relationship of modified examples, detailed or supplemental descriptions of a portion or a total of the others.

Further, in the following embodiments, when a number of elements including number of pieces, numerical-value, amount, or range) is referred to, except when particularly specified, and for a case in which the number is limited to a specific number clearly as a principle, the number is not limited to the specific number, but may be equal to or larger than or equal to or smaller than the specific number.

Further, in the following description of the embodiments, a constituent element (including element step) is not naturally indispensable necessarily except when particularly specified or for a case in which it is regarded as clearly indispensable.

Similarly, in the following description of the embodiments, when a shape or a positional relationship of a constituent element is referred to, except when particularly specified, and for a case regarded otherwise clearly in principle, a constituent element having a shape substantially proximate or similar to the shape is included. This is the same as considerations of the numerical value and the range.

Further, portions having the same functions in all the drawings of the embodiments are given the same reference notations, and repetitive explanation thereof will be omitted.

Further, in the description of the embodiments, MISFET (Metal Insulator Semiconductor Field Effect Transistor), representing a field effect transistor, is abbreviated simply as MIS, a MISFET of the channel type is abbreviated as pMIS and a MISFET of the n-channel type is abbreviated as nMIS.

A detailed explanation will be given of embodiments of the present invention with reference to the drawings.

EMBODIMENT 1

Figure 1:
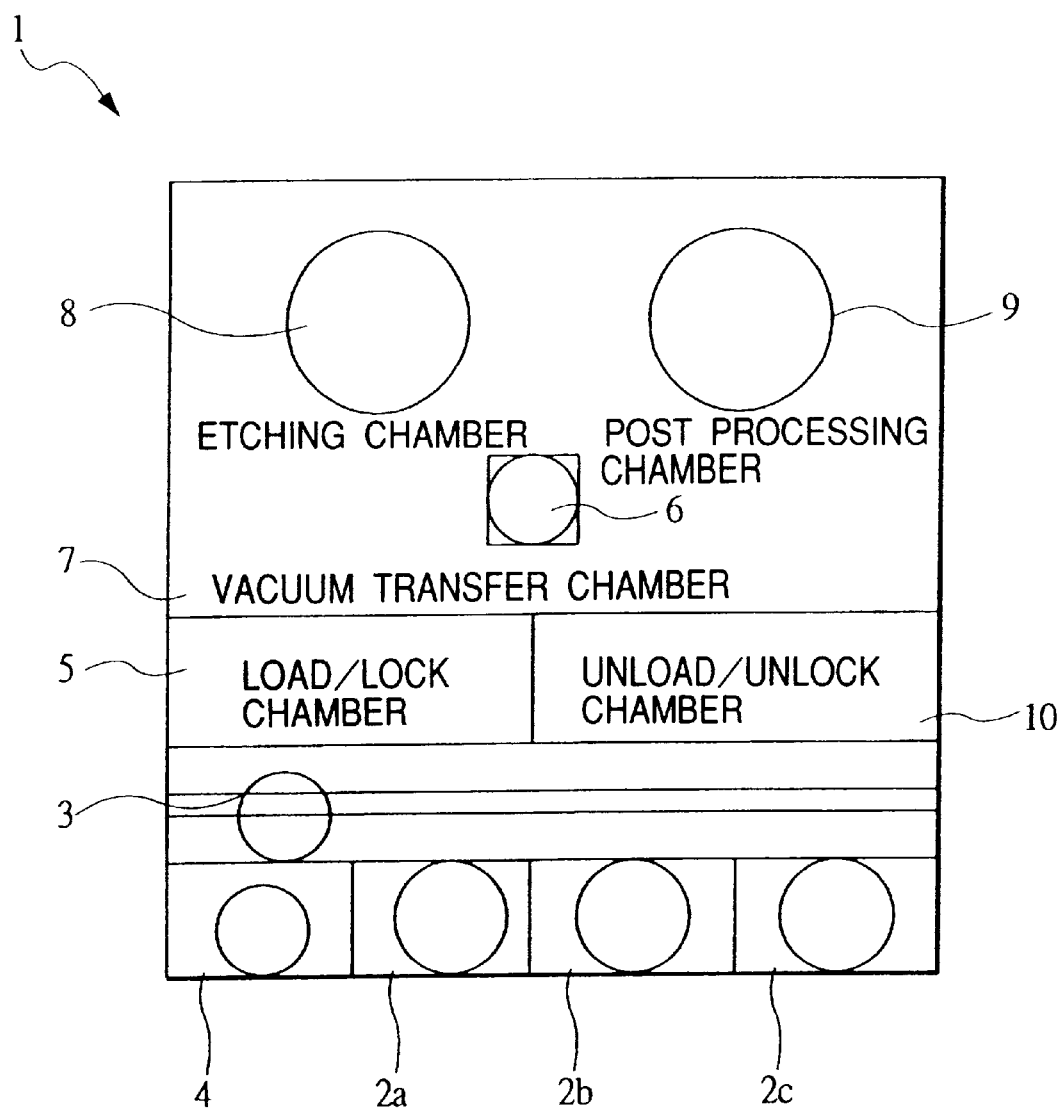
FIG. 1 is a diagram of an etching apparatus used for a method of fabrication of semiconductor integrated circuit devices according to an embodiment of the invention.

FIG. 1 exemplifies the constitution of an etching apparatus 1 used to perform a fabrication method in the manufacture of a semiconductor integrated circuit device according to Embodiment 1.

The etching apparatus 1 is an apparatus for carrying out a series of precessing for patterning a wiring forming film having an SiGe layer into a predetermined shape. A semiconductor wafer to be subjected to etching processing is mounted at an arbitrary location of wafer cassette bases 2a through 2c. The semiconductor wafer at the wafer cassette bases 2a through 2c is transferred to an alignment unit 4 by an atmospheric transfer robot 3. At the alignment unit 4, alignment of the direction of a notch or an orientation flat of the semiconductor wafer is carried out. The semiconductor wafer, after the alignment processing, is transferred to a load/lock chamber 5 again by the atmospheric transfer robot 3. Evacuation is carried out in the load/lock chamber 5 when the semiconductor wafer is transferred therein. When the inside of the load/lock chamber 5 has reached a desired vacuum state, the semiconductor wafer passes through a vacuum transfer chamber 7 and is transferred into an etching chamber 8 by a vacuum transfer robot 6. Further, a vacuum state is maintained in the vacuum transfer chamber 7.

In the etching chamber 8, a wiring forming film having an SiGe layer is patterned to a predetermined shape by, for example, a plasma dry etching processing. As an electricity discharge system in the etching chamber 8, there can be used any of the known electricity discharge systems, such as ECR (Electron Cyclotron Resonance), RIE (Reactive Ion Etching), two frequency RIE, magnetron RIE and ICP (Inductively Coupled Plasma). Etching gas is produced by a single gas or a mixed gas of $Cl_2$, HBr, $O_2$, as will be explained later in more detail. At a first step of the etching processing, there is used a single gas of $Cl_2$ having a low selection ratio with regard to a silicon oxide film ($SiO_2$) and at and after a second step, a gas, for example, HBr/$Cl^2$ or HBr/$Cl_2$/$O_2$, is used to provide an anisotropic shape. At a terminal point detecting step and an overetching step of the etching processing, a gas having a high selection ratio with regard to a silicon oxide film, such as HBr/$O_2$ or $Cl_2$/$O_2$, is used.

The semiconductor wafer, after completion of the etching processing passes through the vacuum transfer chamber 7 and is transferred into a postprocessing chamber 9 again by the vacuum transfer robot 6. That is, the semiconductor wafer, after completion of the etching processing, is transferred into the postprocessing chamber 9 while maintaining the vacuum state without being brought into contact with the outside air. In the postprocessing chamber 9, plasma processing is carried out on the semiconductor wafer, as will be explained later in more detail. With regard to the electricity discharge system of the postprocessing chamber 9, similar to the etching chamber 8, there can be used any of the known discharge systems, such as ECR, RIE, two frequency RIE, magnetron RIE or ICP. The semiconductor wafer, after completion of the postprocessing, is transferred to an unload/unlock chamber 10 again by the vacuum transfer robot 6 and is returned to the wafer cassette bases 2a through 2c by the atmospheric transfer robot 3.

Next, with respect to Embodiment 1, an explanation will be given of a case of applying the invention to, for example, a system LSI (Large Scale Integrated Circuit) having a logic circuit and a memory circuit on the same semiconductor substrate, with reference to FIG. 2 through FIG. 15. Further, FIG. 4(b) through FIG. 9(b) and FIG. 11(b) through FIG. 15(b) are sectional views enlarging essential portions of an NMIS forming area of FIG. 4(a) through FIG. 9(a) and FIG. 11(a) through FIG. 15(a). A gate electrode structure of a pMIS forming area is the same as the gate electrode structure of the NMIS forming area, and, accordingly, illustration thereof are omitted. Further, FIG. 8(a) is a view which illustrates a problem in the technology investigated by the present inventors.

Figure 2:
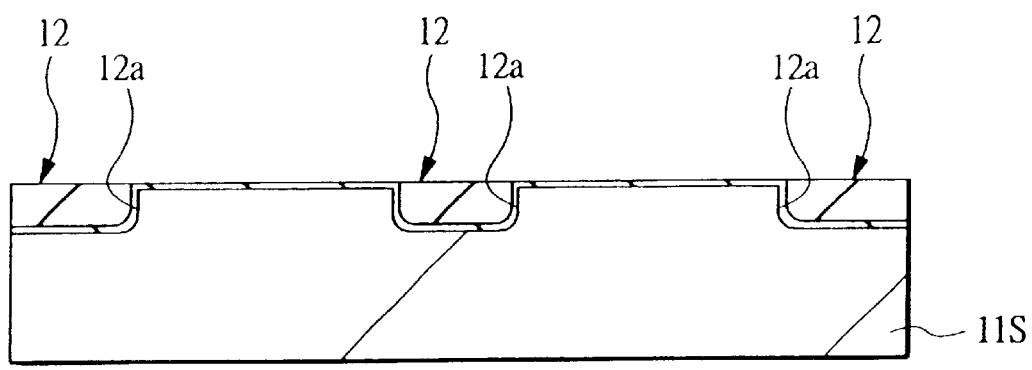
FIG. 2 is a sectional view of essential portions in a fabrication step of the semiconductor integrated circuit device according to the embodiment of the invention.

First, as shown by FIG. 2, there is prepared a semiconductor substrate 11S comprising, for example, p-type single crystal silicon. The semiconductor substrate 11S at this stage is a semiconductor thin plate having a planar circular shape of about, for example, 8 inches (=about 20 cm), called a semiconductor wafer. Grooves 12a having a depth of about 300 through 400 nm are formed in a main face of the semiconductor substrate 11S. The groove 12a is formed by covering an element forming area of the semiconductor substrate 11S with a silicon nitride film and thereafter subjecting the semiconductor substrate 11 at an element separating area to dry etching using the silicon nitride film as a mask.

Successively, by depositing a silicon oxide film having a film thickness of, for example, about 600 nm over the semiconductor substrate 11S including inner portions of the grooves 12a by a CVD (Chemical Vapor Deposition) process and thereafter leaving the silicon oxide film only at the inner portions of the grooves 12a by polishing the silicon oxide film by a CMP (Chemical Mechanical Polishing) process, at the element separating area of the semiconductor substrate 11S, there is formed an element separating portion 12 (trench isolation) of, for example, a groove type and an active area is formed at the element forming area surrounded thereby as seen in plane view.

Figure 3:
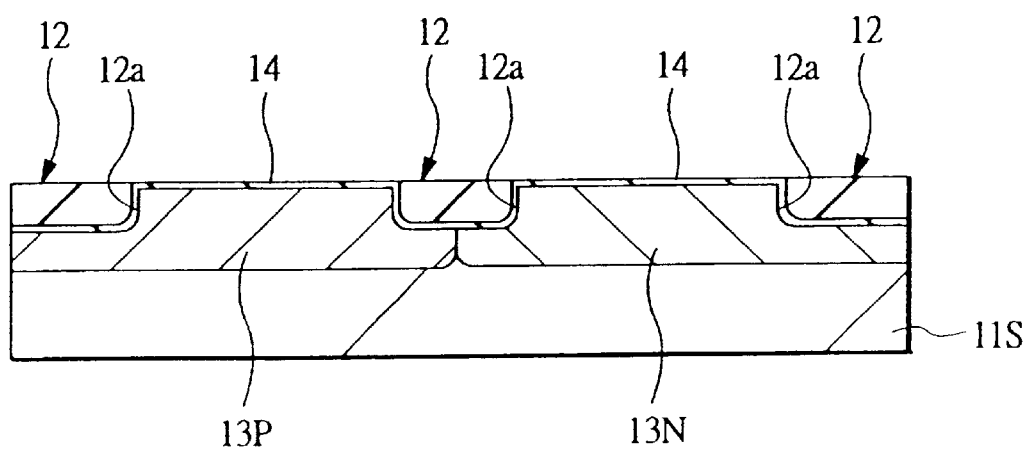
FIG. 3 is a sectional view of essential portions in a fabrication step of the semiconductor integrated circuit device subsequent to the step shown in FIG. 2.

Thereafter, as shown by FIG. 3, at an NMIS forming area of the semiconductor substrate 11S, a p-type well 13P is formed by ion-implanting, for example, boron thereto and at a pMIS forming area, an n-type well 13N is formed by ion-implanting, for example, phosphor thereto. Further, at this time, at the nMIS forming area, an impurity (for example, boron) for controlling the threshold voltage of the nMIS is ion-implanted thereto and at the pMIS forming area, an impurity (for example, phosphor) for controlling the threshold voltage of the pMIS is ion-implanted.

Next, by cleaning respective surfaces of the p-type well 13P and the n-type well 13N by using a cleaning solution of HF (hydrofluoric acid) species and thereafter subjecting the semiconductor substrate 11S to wet oxidation at an elevated temperature of, for example, about 850° C., clean gate insulating films 14 each comprising a silicon oxide film are formed on the respective surfaces of the p-type well 13P and the n-type well 13N. The film thickness of the gate insulating film 14 is, for example, equal to or smaller than 3 nm, for example, about 2.5 nm. Further, the film thickness of the gate insulating film 14, mentioned here, is a film thickness converted into that of a silicon dioxide film and may not coincide with an actual film thickness.

The gate insulating film 14 may be constituted by a silicon oxynitride film in place of the silicon oxide film. That is, when the film thickness of the gate insulating film 14 is thinned, as described later, a portion of an impurity (boron) in an SiGe layer, constituting a portion of a gate electrode by heat treatment in the processing, penetrates the gate insulating film 14 find is diffused into the semiconductor substrate 11S, and the threshold voltage is liable to vary. In comparison with the silicon oxide film, the impurity is difficult to penetrate the silicon oxynitride film, and, accordingly, by constituting the gate insulating film 14 by the silicon oxynitride film, the threshold voltage can be restrained from varying. Further, with use of the silicon oxynitride film, in comparison with the silicon oxide film, there is provided a high effect of restraining the occurrence of interfacial level or reducing electron trap in the film, and, accordingly, hot-carrier resistance of the gate insulating film 14 can be promoted and the insulation resistance can be promoted.

In forming the silicon oxynitride film, for example, a semiconductor substrate 1 may be subjected to a heat treatment in a nitrogen gas atmosphere, such as NO, $NO_2$ or $NH_3$. Further, an effect similar to the above-described can be achieved by forming the gate insulating films 14 comprising silicon oxide at respective surfaces of the p-type well 13P and the n-type well 13N, and thereafter subjecting the semiconductor substrate 11S to heat treatment in the above-described nitrogen gas atmosphere and segregating nitrogen at an interface of the gate insulating film 14 and the semiconductor substrate 11S.

Further, the gate insulating film 14 may be formed by, for example, a silicon nitride film or a composite insulating film of a silicon oxide film and a silicon nitride film. When the gate insulating film 14 comprising silicon oxide is thinned to less than 5 nm, more particularly, to less than 3 nm, by a film thickness converted into that of a silicon dioxide film, a deterioration in insulation resistance is achieved directly by generating tunnel current or hot carriers caused by stress. The silicon nitride film is provided with a dielectric constant higher than that of the silicon oxide film, and, accordingly, the silicon dioxide conversion film thickness becomes thinner than an actual film thickness. That is, in the case of providing the silicon nitride film, even when the silicon nitride film is physically thick, there can be provided a capacitance equivalent to that of the relatively thin silicon dioxide film. Therefore, by constituting the gate insulating film 14 of a single silicon nitride film or a composite film of silicon nitride and silicon oxide, the effective film thickness can be made thicker than that of the gate insulating film constituted by a silicon oxide film, and, accordingly, a deterioration of the insulation resistance can be reduced by generation of tunnel leakage current or hot carriers.

In this case, the silicon dioxide conversion film thickness (hereinafter, simply referred to as converted film thickness) dr of a single insulating film or a composite insulating film is defined by the following equation when the specific dielectric constant of an insulating film constituting an object is designated by notation ϵi, the film thickness thereof is designated by notation di and the specific dielectric constant of silicon dioxide is designated by ϵs.

$$dr = \sum \frac{\epsilon i}{\epsilon s} di$$

For example, dielectric constants of silicon oxide ($SiO_2$) and silicon nitride ($Si_3N_4$) are respectively 4 through 4.2 and 8. Hence, by carrying out a calculation in which the dielectric constant of silicon nitride is set to twice as much as the dielectric constant of silicon oxide, for example, the silicon dioxide conversion film thickness of the silicon nitride film having a film thickness of 6 nm becomes 3 nm. That is, the capacitance of the gate insulating film comprising a composite film, in which the silicon nitride film has a film thickness of 6 nm, is equal to that of a gate insulating film comprising a silicon oxide film having a film.thickness of 3 nm. Further, the capacitance of the gate insulating film comprising a silicon oxide film having a film thickness of 2 nm and a silicon nitride film having a film thickness of 2 nm (converted film thickness 1 nm) is the same as the capacitance of a gate insulating film comprising a single silicon oxide film having a film thickness of 3 nm.

Figure 4A:
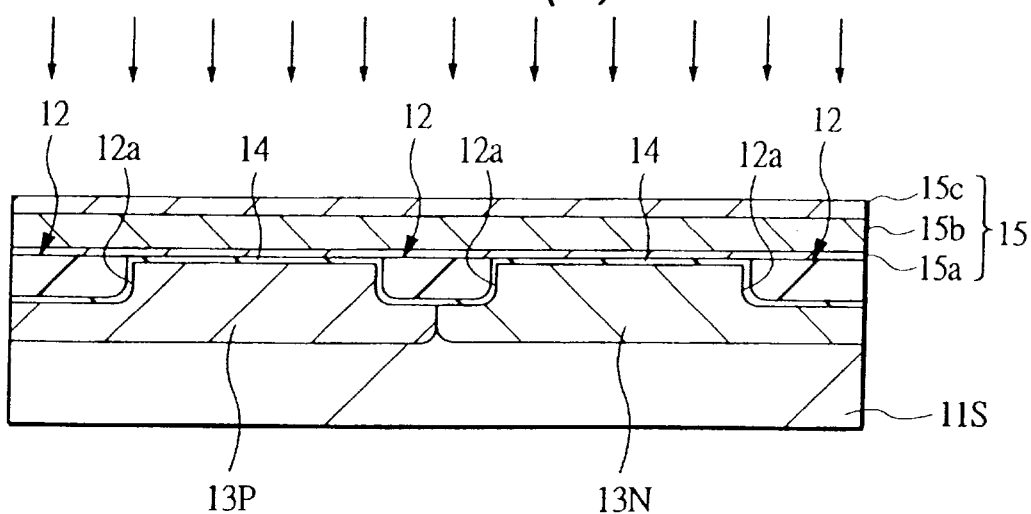
FIG. 4(a) is a sectional view of essential portions in a fabrication step of the semiconductor integrated circuit device subsequent to the step shown in FIG. 3.
Figure 4B:
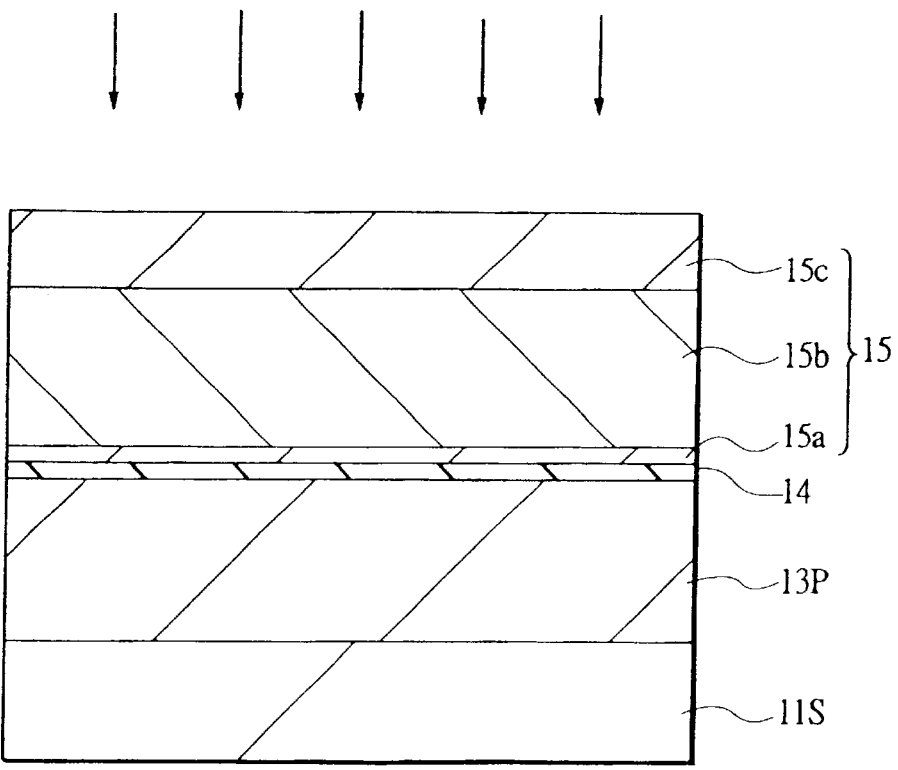
FIG. 4(b) is a sectional view enlarging essential portions of an area in which an n-channel type MISFET is shown in FIG. 4(a)

Successively, as shown by FIGS. 4(a) and 4(b), a gate electrode forming film 15 is formed by successively depositing a polycrystal silicon layer 15a, an SiGe layer 15b and a polycrystal silicon layer 15c over the semiconductor substrate 11S from lower layers by a CVD process.

The polycrystal silicon layer 15a is provided with a function of assisting in the formation of the SiGe layer 15b without effecting an undesirable influence on the electric properties. That is, the polycrystal silicon layer 15a assists in the formation of nuclei at an initial stage of film formation in forming the SiGe layer 15b thereabove and forms the SiGe layer 15b having a uniform thickness. When the polycrystal silicon layer 15a is not present, nuclei formation at the initial stage of film formation of the SiGe layer 15b is difficult to carry out and irregularities of the SiGe layer 15b are enlarged. The thickness of the polycrystal silicon layer 15a is, for example, about 3 nm.

The SiGe layer 15b is deposited over the polycrystal silicon layer 15a. The thickness of the SiGe layer 15b is, for example, about 100 through 200 nm. Further, according to the composition of the SiGe layer 15b, the concentration of Ge is made to be equal to or larger than 10% of the total. The higher the concentration in Ge of the SiGe layer 15b is, the more preferable will be the result. This is the case, for example, for the following reason. Boron is introduced to the SiGe layer 15b to reduce the resistance and set the work function to a predetermined value; and, when the concentration of Ge of the SiGe layer 15b is high, the concentration of boron can be reduced and, therefore, boron depletion can be restrained and vacancy formation caused by boron depletion can be restrained or prevented. The reason for the ability to reduce the concentration of boron resides in the fact that, when the concentration of Ge in the SiGe layer 15b is high, the activation efficiency of boron can be promoted and, therefore, even when the concentration of boron is low, the resistance of the SiGe layer 15b can be reduced. Further, when the concentration of Ge in the SiGe layer 15b is high, even when the concentration of boron is low, the work function of the SiGe layer 15b can be made a predetermined value.

Hence, according to Embodiment 1, the concentration of Ge is made equal to or larger than 20%, preferably, equal to or larger than 40%. As will be described later, when the concentration of Ge in the SiGe layer 15b is high, in the postprocessing after patterning the SiGe layer 15b, there is produced a so-to-speak side etching in which the side faces of the SiGe layer 15b are polished; however, according to Embodiment 1, the side etching can be restrained or prevented and, therefore, the concentration of Ge can be made high.

Particularly, in an area in which the concentration of Ge of the SiGe layer 15b is equal to or larger than 40%, in a CMIS (Complementary MIS) circuit, the gate electrode can be formed as a single gate electrode structure. That is, when a gate electrode material is constituted by polycrystal silicon, there is a case of adopting a so-to-speak dual gate electrode structure in which a gate electrode of the nMIS of the CMOS circuit is constituted by n-type polycrystal silicon, by introducing phosphor, and a gate electrode of pMIS is constituted by p-type polycrystal silicon by introducing boron. According to the structure, a reduction in the threshold voltage of the nMIS and the pMIS can be prevented by changing the work function of the gate electrode in accordance with the nMIS and pMIS without increasing the concentration of impurity the semiconductor substrate. However, phosphor and boron are selectively introduced with different photoresist films as masks and, accordingly, fabrication steps become complicated; and, further, the number of fabrication steps is increased and, accordingly, an increase in the cost of the product results. Further, in patterning a gate electrode using etching processing, the impurity included in a gate electrode portion differs in the nMIS and pMIS; and, accordingly, there is produced a difference in the shape of the gate. electrode, so that a dispersion is caused in dimensions of fabricating the gate electrode, and the accuracy of fabrication dimensions is deteriorated.

In contrast thereto, according to Embodiment 1, by making the concentration of Ge in the SiGe layer 15b equal to or larger than 40%, the work function of the SiG6 layer 15b can easily be set to a value between the work function of the n-type polycrystal silicon (about 4.15 V) and the work function of the p-type polycrystal silicon (bout 5.15 V) by introducing boron. Therefore, it is not necessary to introduce two kinds of impurities, such as phosphor and boron, to the gate electrode. That is, the gate electrodes of both of the nMIS and the pMIS can be constructed by a p-type single gate electrode structure by introducing only boron. Therefore, according to Embodiment 1, a reduction in threshold voltage of the nMIS and the pMIS constituting the CMOs circuit can be prevented without increasing the concentration of the impurity of the semiconductor substrate 11S. Further, the fabrication steps used in the production of a semiconductor integrated circuit device can be simplified. Further, the number of fabrication steps needed in the production of a semiconductor integrated circuit device can be reduced. Therefore, the time needed for development and fabrication of a semiconductor integrated circuit device can be shortened. Further, the cost of a semiconductor integrated circuit device can be reduced. Further, in patterning a gate electrode, it is not necessary to consider a difference in the shape of the gate electrode for the mMIS and the pMIS, and a dispersion in dimensions of fabricating the gate electrode in the nMIS and the pMIS can be reduced; and, accordingly, the accuracy of dimensions of fabricating the gate electrode can be promoted. Therefore, the yield of a semiconductor integrated circuit device can be promoted. Further, the performance of a semiconductor integrated circuit device can be promoted.

The SiGe layer 15b can be formed by a CVD process using a mixed gas of monosilane ($SiH_4$) and gernane ($GeH_4$) However, in forming the SiGe layer 15b, boron may be introduced in situ in forming the SiGe layer by depositing the layer by a CVD process using silane ($SiH_4$), germane ($GeH_4$) and diborane ($B_2H_6$) as source gases.

The polycrystal silicon layer 15c is deposited over the SiGe layer 15b. The polycrystal silicon layer 15c is provided in consideration of depositing cobalt (Co) and forming a cobalt silicide layer, as will be described later. That is, when Co is formed directly over the SiGe layer 15b, the compatibility is low between SiGe and Co, and resistance value of the gate electrode becomes high; and, accordingly, the polycrystal silicon layer 15c is provided to prevent. The thickness of the polycrystal silicon layer 15c is set such that, in removing a mask made of silicon oxide formed over the polycrystal silicon layer 15c by etching, as will be described later, the polycrystal silicon layer 15c is not penetrated even by an overetching processing thereof and is, for example, about 50 nm. This is for preventing the SiGe layer 15b from being exposed directly to a cleaning solution in a cleaning processing which is carried out after removing the mask by etching.

Next, as shown by arrows in FIG. 4(a), boron, as mentioned above, is introduced to the gate electrode forming film 15 by an ion implantation process. As described above, with the SiGe layer 15b having a concentration of Ge equal to or larger than 40%, there is constructed a single gate electrode structure of only boron. Further, when boron is introduced in situ in forming the SiGe layer 15b, as described above, it is not necessary to ion-implant boron again.

Figure 5A:
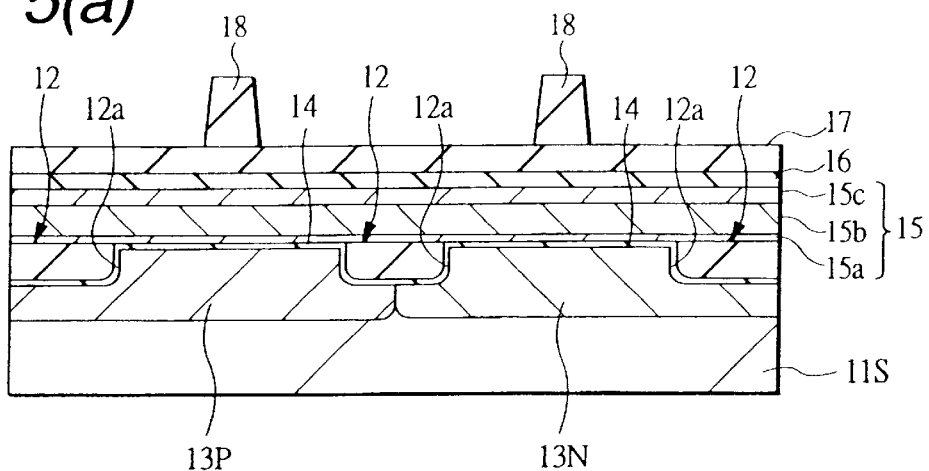
FIG. 5(a) is a sectional view of essential portions in a fabrication step of the semiconductor integrated circuit device subsequent to the step shown in FIG. 4(a)
Figure 5B:
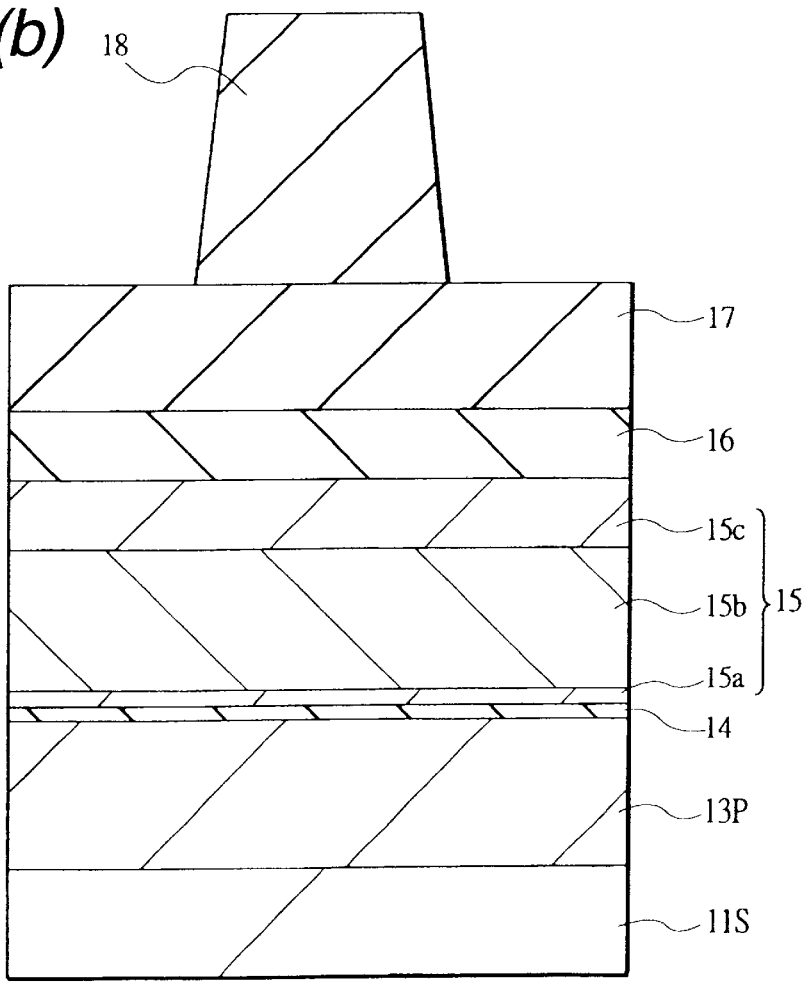
FIG. 5(b) is a sectional view enlarging essential portions of an area in which the n-channel type MISFET is shown in FIG. 5(a)

Successively, as shown by FIGS. 5(a) and 5(b), an insulating film 16 comprising, for example, a silicon oxide film is formed over the polycrystal silicon layer 15c by a CVD process. The insulating film 16 constitutes a mask used in patterning a gate electrode forming film by a dry etching process. The film thickness of the insulating film 16 needs to be set to a sufficient thickness such that when the SiGe layer 15b is etched, a matrix thereof is not etched and is, for example, about 50 nm.

Thereafter, after coating a reflection preventive film 17, having a thickness of, for example, 0.1 $\mu$m over the insulating film 16, a photoresist pattern 18 having a thickness of, for example, about 0.5 $\mu$m is formed thereabove. The photoresist pattern 18 is formed by coating an organic photo resist film over the reflection preventive film 17 and exposing the photoresist film by irradiating the photoresist film with exposure beam, such as an excimer laser beam, via a photomask.

Next, using the photoresist pattern 18 as an etching mask, the reflection preventive film 17 and the insulating film 16 exposed therefrom are etched and removed by a dry etching process. In this case, in etching processing of the reflection preventive film 17 and the insulating film 16, there is used, for example, an etching apparatus of a parallel flat plate type, and the reflection preventive film 17 and the insulating film 16 are etching processed using separate chambers.

In the processing to etch the reflection preventive film 17, for example, $O_2/N_2/CF_4$ is used as a process gas. Further, in the processing to etch the insulating film 16, for example, $C_4F_8/Ar/O_2$ is used as a process gas. In the processing to etch the insulating film 16, by using a gas having a high carbon rate, such as $C_4F_8$, a selectivity of etch rate with respect to the polycrystal silicon layer 15c of the matrix can be provided; and, accordingly, the amount of polishing of the polycrystal silicon layer 15c can be reduced.

Figure 6A:
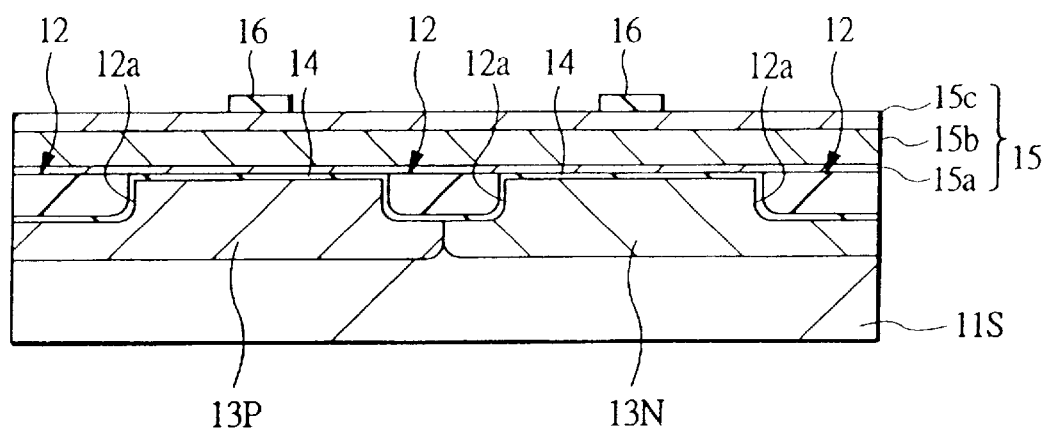
FIG. 6(a) is a sectional view of essential portions in a fabrication step of the semiconductor integrated circuit device subsequent to the step shown in FIG. 5(a)
Figure 6B:
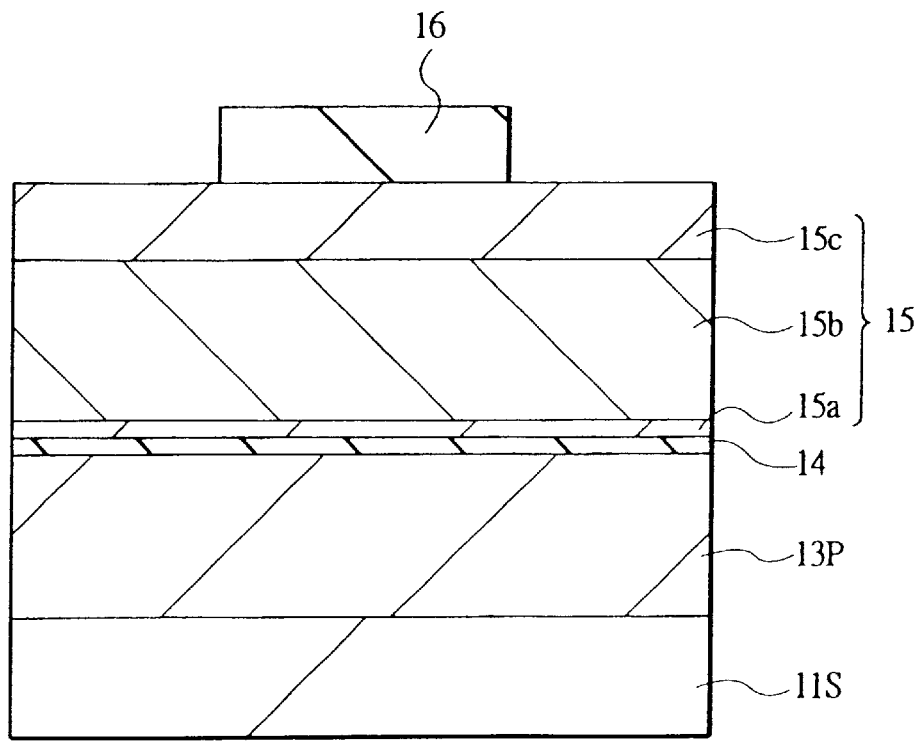
FIG. 6(b) is a sectional view enlarging essential portions of an area in which the n-channel type MISFET shown in FIG. 6(a)

Successively, by removing the photoresist pattern 18 and the reflection preventive film 17 by ashing as shown by FIGS. 6(a) and 6(b), and, thereafter, subjecting the semiconductor substrate 11S to wet cleaning processing, polymers produced by the dry etching processing are removed.

Thereafter, using the insulating film 16 patterned by the dry etching processing as an etching mask, the gate electrode forming film 15 (that is, polycrystal silicon layer 15a, SiGe layer 15b and polycrystal silicon layer 15c) exposed therefrom is etched and removed by a dry etching process.

The dry etching processing is carried out in the etching chamber 8 inside of the etching apparatus 1 shown in FIG. 1. In the processing, there are a required anisotropic shape (verticalness) and a high selectivity with respect to the gate insulating film 14 of the matrix. Therefore, according to Embodiment 1, for example, a microwave etcher is used, and the etching conditions are constituted by, for example, the following five stage steps.

A first step is constituted by a condition nonselective with regard to the silicon oxide film. For example, $Cl_2$ is used as a process gas, and the flow rate thereof is set to, for example, about 80 ml/min. Further, the pressure is set to, for example, about 0.4 Pa. Further, the microwave/RF is set to, for example, about 400/80 W. The processing time period is set to, for example, about 5 sec.

A second step is constituted by a condition mainly for providing stability of electricity discharge. For example, $HBr/Cl_2$ is used as a process gas and the flow rate thereof is set to, for example, about 90 through 20 ml/min. Further, the pressure is set to, for example, about 0.4 Pa. Further, the microwave/RF is set to, for example, about 800/40 W. The processing time period is set to, for example, about 2 sec.

A third step is constituted by a condition having low selectivity with regard to the silicon oxide film. Material up to a thickness position at the middle of the SiGe layer 15b is etched and removed by the third step. For example, $HBr/Cl_2/O_2$ is used as a process gas and the flow rate thereof is set to, for example, about 90/20/3 ml/min. Further, the pressure is set to, for example, about 0.4 Pa. Further, the microwave/RF is set to, for example, about 400/30 (or 40) W. The processing time period is set to, for example, about 30 sec.

A fourth step is constituted by a condition having high selectivity with respect to the silicon oxide film. By the fourth step, portions up to the polycrystal silicon layer 15a of the lowermost layer are all etched and removed Oust etching). The just etching mentioned here refers to a time point at which the gate-insulating film 14 is exposed at a portion thereof excluding stepped portions of the element separating portions 12. For example, $HBr/O_2$ is used as a process gas and the flow rate thereof is set to, for example, about 74/3 ml/min. Further, pressure is set to, for example, about 0.4 Pa. Further, the microwave/RF is set to, for example, about 400/25 W. The processing time period is set to achieve the just etching level. In this case, when $HBr/O_2$ is used, by detecting SiBr (wavelength=426 mn), further, when $Cl_2/O_2$ is used, by detecting SiCl (wavelength=391 nm), respective end points can be detected.

A fifth step is an overetching processing and is constituted by removing a residue of etching of the polycrystal silicon layers 15a and 15b. As a process gas, there is used, for example, $HBr/O_2$ or $Cl_2/O_2$ having a high selectivity with respect to the silicon oxide film, as mentioned above, and the flow rate thereof is set to, for example, about 105/8 ml/min. Further, the pressure is set to, for example, about 0.6 Pa. Further, the microwave/RF is set to, for example, about 400/45 W. The processing time period is set to, for example, about 30 sec.

Figure 7A:
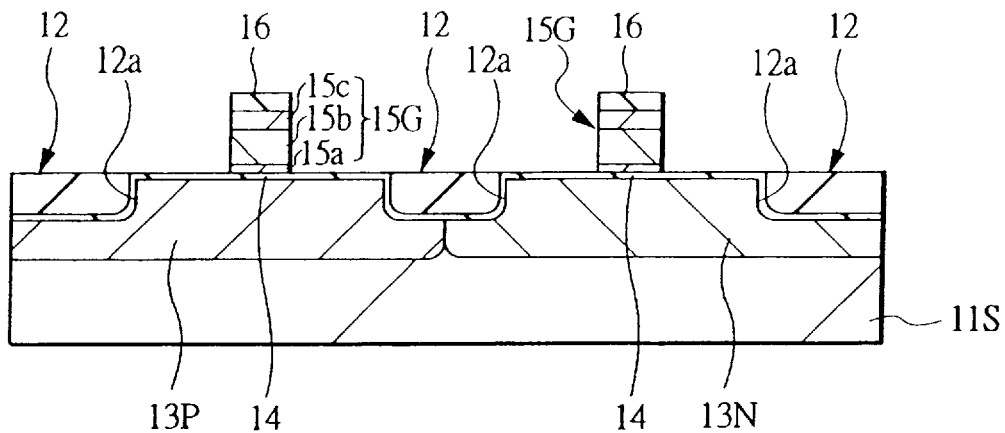
FIG. 7(a) is a sectional view of essential portions in a fabrication step of the semiconductor integrated circuit device subsequent to the step shown in FIG. 6(a)
Figure 7B:
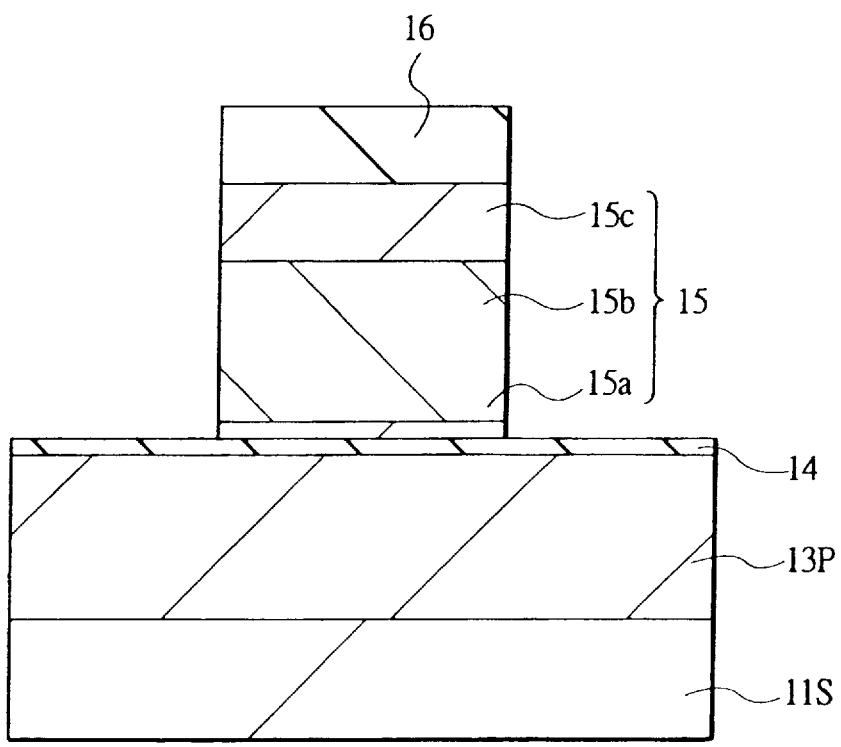
FIG. 7(b) is a sectional view enlarging essential portions of an area in which the n-channel type MISFET is shown in FIG. 7(a)
Figure 8A:
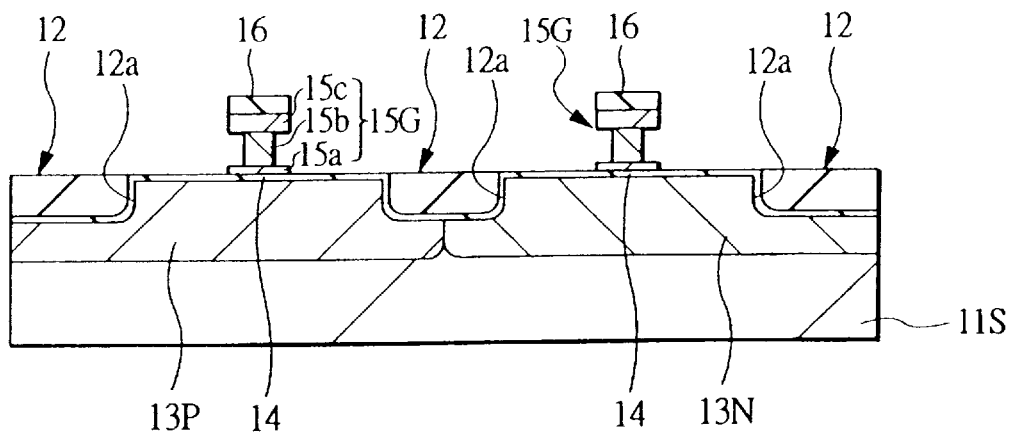
FIG. 8(a) is a partial sectional view of a semiconductor substrate after postprocessing, which illustrates an inherent problem of the technology investigated by the present inventors.

By the processing of etching the gate electrode forming film, as shown by FIGS. 7(a) and 7(b), a gate electrode 15G is formed. After the processing, side faces of the gate electrode 15G are formed substantially orthogonally to the main face of the semiconductor substrate 11S. That is, the side edge is not caused at the side faces of the gate electrode 15G.

Next, the semiconductor substrate 11S, with the processings completed, is taken out of the etching chamber 8 of the etching apparatus 1 of FIG. 1 and is transferred into the postprocessing chamber 9 in a state of maintaining vacuum without exposing the semiconductor substrate 11S to the outside air. The object of the postprocessing resides in removing reaction products (SiCl, SiOCl, SiOBr) including Si produced in the etching of the gate electrode forming film 15 and removing Cl, Br adsorbed to the surface of the semiconductor substrate 11S or reaction products including Cl, Br.

When the postprocessing is not carried out, reaction products (particularly reaction products including Si) cannot be removed only by a cleaning processing thereafter; and, therefore, in later steps, the reaction products are exfoliated to thereby produce foreign matter. Further, when the semiconductor substrate 11S, after completion of the etching processing is returned to a wafer cassette, the reaction products are adhered to a main face of another semiconductor substrate 11S before the etching processing; and, when there is carried out etching processing of the gate electrode forming film with respect to the other semiconductor substrate 11S, the adhered matters constitute a mask to thereby produce a residue of etching.

Further, when Cl or Br adhered to the surface of the semiconductor substrate 11S is not removed, parts of the etching apparatus are corroded by the Cl or Br. Further, Cl or Br is provided with high toxicity, and, accordingly, an adverse influence thereof is effected on the human body. Therefore, the postprocessing after the etching processing is indispensable. Even when polycrystal silicon is used as the gate electrode material, the post processing is carried out, and, for example, $O_2/CHF_3$ is used as a process gas in that case.

Hence, also when the SiGe layer is provided as the gate electrode material, the postprocessing is carried out under the same conditions. That is, similar to the postprocessing when polycrystal silicon is used as a gate electrode material, the postprocessing is carried out by using, for example, $O_2/CHF_3$ gas. The $O_2/CHF_3$ gas is used in the post processing because a stable electricity discharge range is provided; and, further, the gas is generally used in the postprocessing when polycrystal silicon is used as the gate electrode material and is easy to introduce since data amount is enormous.

Figure 8B:
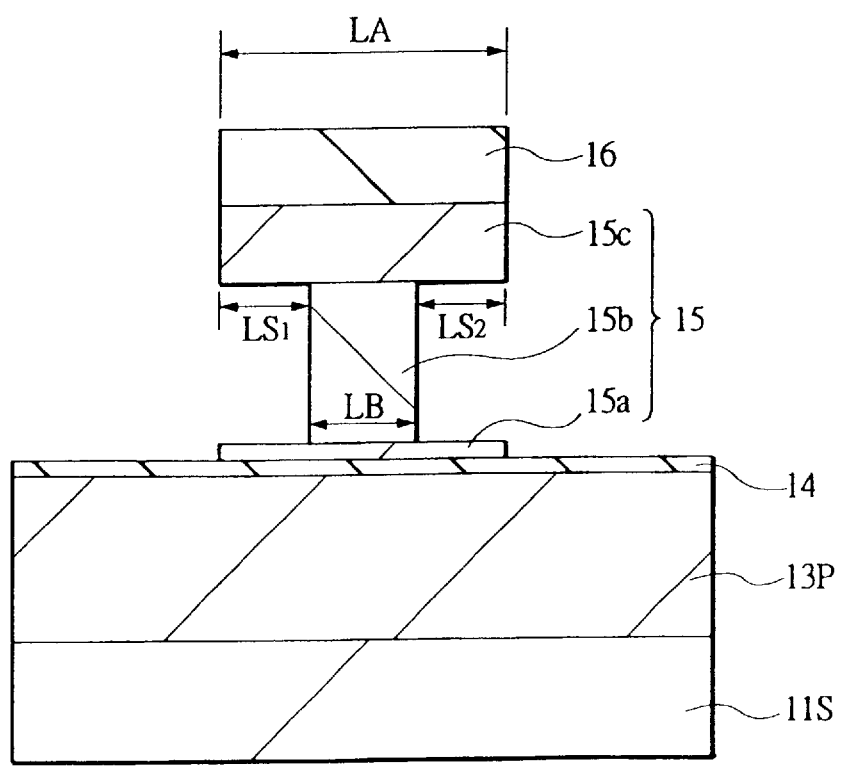
FIG. 8(b) is a sectional view enlarging essential portions of FIG. 8(a)

As a result, as shown in FIGS. 8(a) and 8(b), it has been found by the inventors for the first time that side etching of polishing two side faces of the SiGe layer 15b toward center occurs. Further, an explanation will be given of the amount of side etching in the specification with reference to FIGS. 8(a) and 8(b) as follows. That is, the side etching amount (LS1+LS2) is a value produced by subtracting a length LB in a channel direction of the SiGe layer 15b from a length LA in the channel direction (direction along main face of semiconductor substrate 11S) of the polycrystal silicon layers 15a and 15c of the gate electrode 15G (LS1+LS2= (LA−LB)). Here, when the side etching amount is defined by a rate with respect to the length in the channel direction of the remaining polycrystal silicon layers 15a and 15b, the side etching amount can be represented by ((LA−LB)/LA)× 100(%). In FIGS. 8(a) and 8(b), the side etching amount is about 70% (that is, 70% is polished).

FIGS. 8(a) and 8(b) show a case in which the Ge concentration of the SiGe layer 15b is, for example, 50%. As detailed postprocessing conditions, for example, $O_2/CHF_3=$ 600/40 (ml/min), the pressure is set to 100 Pa, the microwave power is set to 1000 W and the electricity discharge time is set to 20 sec.

Further, although the inventors have carried out postprocessing under the postprocessing condition of reducing the $O_2$ flow rate, for example, $O_2/CHF_3=100/10$ (ml/min), the side etching is caused even in that case. That is, it has been found that the side etching cannot be prevented only by reducing the $O_2$ amount.

However, the side etching is not caused under a condition of a single $O_2$ gas. This is because the etching of Si does not progress, since there is not a fluorine species gas. However, the adhered matter on the surface of the semiconductor substrate cannot be removed only by $O_2$, and, accordingly, the condition cannot be used in the actual process.

Further, the side etching is caused even under a condition of adding a very small amount of $CHF_3$ to $O_2$, for example, a condition of $O_2/CHF_3$=600/10 (ml/min). Further, in an experiment by the inventors, when the Ge concentration of the SiGe layer is 20%, it was found that the side etching is not caused.

As a result of an investigation based on the result of experiment, the inventors have found for the first time that there is conceivable a model in which, when $O_2/CHF_3$ is used for the post processing condition, 0 and Ge explosively react with each other in the plasma, and highly volatile Ge is produced (and accordingly, when the Ge concentration is increased, the side edge amount is increased), with the result that the side etching is caused.

Hence, according to Embodiment 1, as the postprocessing condition, plasma processing is carried out under a mixed gas atmosphere of a gas hardly reactive to Ge and a gas having an etching function of Si. As a gas hardly reactive to Ge, there is used an inert gas, such as argon (Ar) gas; and, further, as a gas having the function of etching Si, there is used a gas including fluorine, such as $CHF_3$.

Figure 9B:
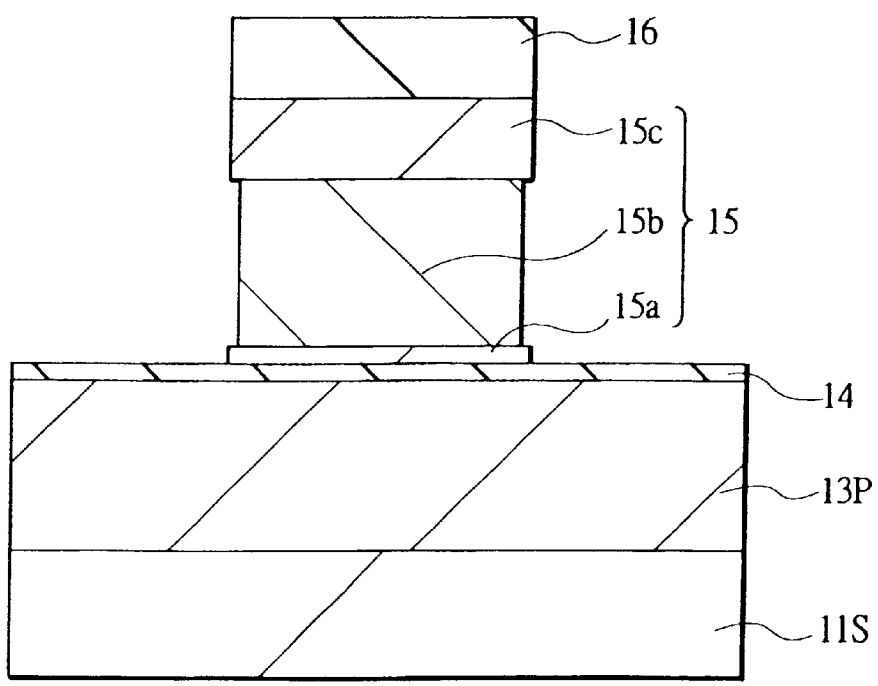

As a result, as shown in FIGS. 9(a) and 9(b), the vertical shape of the side faces of the gate electrode 15 can be retained. Although FIGS. 9(a) and 9(b) exemplify a case of causing more or less side etching, according to the post processing condition, the gate electrode 15G can be formed also in a state of dispensing with the side etching. Further, the time period of the postprocessing in this case is set such that the amount of polishing of the polycrystal silicon layer 15c is set to be substantially in line with the $O_2/CHF_3$ condition, and it is not that the side etching is not caused because the etching amount is small.

An example of specific postprocessing conditions is shown as follows. That is, for example, $Ar/CHF_3$ is about 400/20 (mlimin), the pressure is about 70 Pa, the microwave power is about 750 W and the electricity discharge time period is about 20 sec. Further, the Ge concentration of the SiGe layer 15b is, for example, equal to or larger than 20%. According to a result of experiment by the inventors, under a condition of high concentration of CHF, in the postprocessing, for example, under a condition of $Ar/CHF_3$= 600/40 (ml/min), for example, there is a deposition of a compound including Si, H (hydrogen) and F (fluorine), and the etching is not progressed; and, therefore, the concentration of $CHF_3$ is pertinently equal to or lower than about 5 Further, in comparison with the $O_2/CHF_3$ condition, $Ar/CHF_3$ is provided with a narrow electricity discharge stabilized region and electricity discharge becomes unstable under a condition in which the pressure is equal to or higher than 80 Pa or the microwave power is equal to or larger than 1000 W. Therefore, from the above-described conditions, it is preferable, as the postprocessing conditions, that the concentration of $CHF_3$ is about 5%, the pressure is equal to or lower than 70 Pa and the microwave power is about 750 W.

Further, although according to the above-described postprocessing conditions, as a gas hardly reactive to Ge, Ar having high electricity discharge stability is used, the gas is not limited thereto, but can be changed variously. In place of Ar, for example, there can also be used another inert gas, such as helium (He), neon (Ne), krypton (Kr) or xenon (Xe). Further, nitrogen ($N_2$) gas can also be used in place of Ar. In that case, as a result of forming a silicon nitride (SiN) film at surfaces (side faces or upper face) of the gate electrode in the postprocessing, the SiN film becomes a protective film and functions to prevent side etching of two side faces of the gate electrode.

Further, although CHF, is used as a gas having a function of etching Si, the gas is not limited thereto but can be changed variously and in place of $CHF_3$, there can also be used a gas including fluorine such as $CF_4$, $C_2F_6$ or $SF_6$. Under a condition of using a postprocessing gas of $Ar/CF_4$, the etching rate of the polycrystal silicon layers 15a and 15c is large. For example, the etching rate of $Ar/CF_4$=400/40 (ml/min) is about nine times as much as that of $Ar/CHF_3$. Hence, in this case, the postprocessing time period is shortened to, for example, about 5 sec. In this case, the side etching amount is larger than that of $Ar/CHF_3$ to be about 20%, however, side etching under the condition of $O_2/CHF_3$ is not caused. That is, the side etching amount is about 20% in a gas system of $Ar/CF_4$ having a comparatively large side etching. In this way, according to the invention, the side etching amount can be made equal to or lower than 40%; the side etching amount can be made about 20% as an actually provided result when $Ar/CF_4$ gas is used; and the side etching amount can be made equal to or lower than 10% as an actually provided result when $Ar/CHF_3$ gas is used.

In this way, according to Embodiment 1, even after the postprocessing, the sectional shape of the gate electrode 15G having the SiGe layer 15b can be improved. That is, the accuracy of the dimensions of fabricating the gate electrode 15G can be promoted. Therefore, according to Embodiment 1, the yield of the semiconductor integrated circuit device can be promoted. Further, the performance of the semiconductor integrated circuit device can be promoted.

FIG. 10 shows a result of investigating the performance of removing Cl or Br, which has adhered to the semiconductor substrate 11S, by total reflection fluorescent X-ray processing. Notations Al through A3 of the abscissa of FIG. 10 indicate a case of using $Ar/CHF_3$ as a postprocessing gas (present invention). Notation Al denotes a case of the postprocessing time period of 10 sec., the notation A2 designates a case of the postprocessing time period of 20 sec, and the notation A3 designates a case of the postprocessing time period of 25 sec. Further, the notation B designates a case of using $Ar/CF_4$ as a postprocessing gas (present invention) and having a postprocessing time period of 5 sec. Further, the notation C designates a case of using $O_2/CHF_3$ as the postprocessing gas condition (technology investigated by the inventors) and a postprocessing time period of 20 sec. Notation D designates a case in which the postprocessing is not carried out and the notation E designates a case in which patterning and postprocessing of the gate electrode are not carried out. It is apparent from FIG. 10 that under the $Ar/CHF_3$ condition, with regard to the performance of removing Cl and Br, there is achieved an effect equal to or higher than the $O_2CHF_3$ condition. After the above-described postprocessing, the semiconductor substrate 11S is taken out from the etching apparatus 1 shown in FIG. 1.

Next, as shown by FIGS. 11(a) and 11(b), by ion-implanting, for example, phosphor to NMIS forming areas using the gate electrode 15G as a mask, there are formed n-type semiconductor areas 19a having a low concentration of impurity constituting a source and a drain (LDD; Lightly Doped Drain) of the NMIS. Successively, by ion-implanting, for example, boron to the pMIS forming areas using the gate electrode 15G as a mask, there are formed p⁻-type semiconductor areas 20a having a low concentration of impurity constituting a source and a drain (LDD) of the pMIS.

Successively, after depositing an insulating film made of, for example, silicon oxide over the semiconductor substrate 11S by a CVD process, the deposit is etched back by anisotropic dry etching. At this time, the insulating film 16 is also etched back and the polycrystal silicon layer 15c is exposed. In this way, as shown in FIGS. 12(a) and 12(b), there are formed side walls (side wall insulating films) 21 at both side faces of the gate electrode 15G.

Thereafter, as shown in FIGS. 13(a) and 13(b), by ion-implanting, for example, phosphor to the nMIS forming areas using the gate electrode 15G and the side walls 21 as masks, there are formed n$^+$-type semiconductor areas 19b having a high concentration of impurity constituting the source and the drain of the nMIS. Successively, by ion-implanting, for example, boron to the pMIS forming areas using the gate electrode 15G and the side walls 21 as masks, there are formed p$^+$-type semiconductor areas 20b having a high concentration of impurity constituting the source and the drain of the pMIS. By the steps up to this point, there are a substantially finished nMISQn and pMISQp, each having a source and a drain of the LDD structure.

Next, by depositing, for example, cobalt (Co) over the semiconductor substrate 11S by a sputtering process and carrying out a heat treatment, at interface portions in contact with a Co layer and the semiconductor substrate 11S and the polycrystal silicon layer 15c, there are formed silicide layers 22 made of, for example, cobalt silicide (CoSi$_x$) (silicide process), as shown in FIG. 14(a). By forming such silicide layers 22, the contact resistance between wirings and the n-type semiconductor areas 19b, the p$^+$-type semiconductor areas 20b and the gate electrodes 15G tan be reduced. Further, the parasitic capacitance can be reduced. Therefore, an increase in the operational speed of the semiconductor integrated circuit device having very small elements (nMISQn, pMISQp) can be promoted. Further, in place of the cobalt silicide layer, a tungsten silicide layer or a titanium silicide layer can also be constituted.

Successively, as shown in FIG. 15, after depositing an insulating film 23a comprising, for example, a silicon oxide film over the semiconductor substrate 11S by a CVD process, contact holes 24 are formed in the insulating film 23a to expose the silicide layers 22. Thereafter, by depositing, for example, tungsten or titanium nitride (TiN) over the semiconductor substrate 11S by a sputtering process and thereafter depositing, for example, tungsten thereabove by a CVD process and polishing the conductive films by a CMP (Chemical Mechanical Polish) process such that the conductive films remain only in the contact holes 24, plugs 25a are formed in the contact holes 24.

Next, by depositing, for example, titanium nitride, aluminum (or aluminum alloy) and titanium nitride over the insulating film 23a and the plugs 25a successively from lower layers by a sputtering process, and thereafter patterning by normal photolithography technology and dry etching technology, first layer wirings 26a are formed.

Successively, after depositing an insulating film 23b comprising, for example, a silicon oxide film over the insulating film 23a by a CVD process, through holes 27 are formed such that portions of the first layer wirings 26a are exposed in the insulating film 23b. Thereafter, after forming plugs 25b in the through holes 27 similar to the plugs 25a, second layer wirings 26b are formed over the insulating film 23b similar to the first layer wirings 26a. Thereafter, by a normal fabrication method of the semiconductor integrated circuit device, there is fabricated a system LSI having a multiple layer wiring structure.

EMBODIMENT 2

In Embodiment 2, an explanation will be given of a case of applying the invention to a method of fabrication of a system LSI having a polymetal gate electrode structure including, for example, an SiGe layer, with reference to FIG. 16(a) through FIG. 22(b). Further, FIG. 16(b) through FIG. 22(b) are sectional views enlarging essential portions of nMIS forming areas of FIGS. 16(a) through 22(a). Also in this case, a gate electrode structure of a pMIS forming area is the same as a gate electrode structure of an NMIS forming area and accordingly, illustration thereof is omitted.

First, after the processing in the steps of FIG. 2 and FIG. 3 used in Embodiment 1, as shown by FIGS. 16(a) and 16(b), similar to Embodiment 1, the gate insulating film 14 is formed over the main face of the semiconductor substrate 11S. Successively, similar to Embodiment 1, the polycrystal silicon layer 15a and the SiGe layer 15b are deposited over the semiconductor substrate 11S successively from the lower layer. Thereafter, as shown by arrows in FIGS. 16(a) and 16(b), similar to Embodiment 1, boron, mentioned above, is introduced to the SiGe layer 15b by an ion implantation process. As described above, also in Embodiment 2, in the SiGe layer 15b having a concentration of Ge equal to or larger than 40 there is constructed a single gate electrode structure only of boron. Further, as described above, when boron is introduced in situ in forming the SiGe layer 15b, it is not necessary to ion-implant boron again.

Next, as shown in FIGS. 17(a) and 17(b), in order to constitute a polymetal gate electrode structure, by depositing a barrier conductor layer 15d having a thickness of, for example, about 5 nm and made of tungsten nitride (WN) or titanium nitride (TiN) over the SiGe layer 15b by a sputtering process and thereafter depositing a metal layer 15e having a thickness of, for example, about 80 nm and made of tungsten (W) or molybdenum (Mo) thereabove, the gate electrode forming film 15 is formed. The barrier conductive layer 15d is provided for, for example, stress relaxation and adherence promotion of the SiGe layer 15b and the metal layer 15e.

Successively, there is formed an insulating film 28 comprising, for example, a silicon nitride film (Si$_3$N$_4$) over the metal layer 15e. In this case, the insulating film 28 is constituted by depositing a silicon nitride film formed by a thermal CVD process over a silicon nitride film formed by a plasma CVD process. This is because the etching rate is lower in the silicon nitride film by the thermal CVD process than in the silicon nitride film by the plasma CVD process (the selection ratio with regard to silicon oxide film is made higher). That is, in forming contact holes in later steps, even when the insulating film 28 is exposed from the contact holes, the insulating film 28 is prevented from being etched and removed.

Thereafter, after forming the reflection preventive film 17 and the photoresist pattern 18 over the insulating film 28, similar to Embodiment 1, using the photoresist pattern 18 as an etching mask, the reflection preventive film 17 and the insulating film 28 exposed therefrom are etched and removed by a dry etching process. In this case, in processing to etch the reflection preventive film 17 and the insulating film 28, there is used, for example, an etching apparatus of the parallel flat plate type, and the reflection preventive film 17 and the insulating film 28 are etching processed by separate chambers. In processing to etch the insulating film 28, there is used, for example, CF$_4$/Ar as a process gas.

Next, similar to Embodiment 1, after removing the photoresist pattern 18 and the reflection preventive film 17 by ashing, as shown in FIGS. 18(a) and 18(b), subjecting the semiconductor substrate 11S to a wet cleaning processing and removing polymers produced by the dry etching processing, with the insulating film 28 patterned by the dry etching processing as an etching mask, the gate electrode forming film 15 (that is, metal layer 15e, barrier conductor layer 15d, SiGe layer 15b and polycrystal silicon layer 15a) exposed therefrom is etched and removed by a dry etching processing.

The dry etching processing is carried out in the etching chamber 8 inside of the etching apparatus 1 shown in FIG. 1. In processing to etch the metal layer 15e and the barrier conductor layer 15d, there an etching processing is carried out at an elevated temperature (for example, about 100 through 150° C.) using, for example, $Cl/O_2$ gas or an etching processing at normal temperature using, for example, $CF_4/O_2/N_2/Cl_2$ gas. An etching processing of the SiGe layer 15b and the polycrystal silicon layer 15a is the same as that in Embodiment 1, and, therefore, an explanation thereof will be omitted.

By the etching processing of the gate electrode forming film 15, as shown in FIGS. 19(a) and 19(b), the gate electrode 15G of a polymetal structure is formed, having the metal layer 15e over the SiGe layer 15b. Also after the processing, the side faces of the gate electrode ISG are formed substantially orthogonal to the main face of the semiconductor substrate 11S. That is, the side etching is not caused at the side faces of the gate electrode 15G.

Next, the semiconductor substrate 11S, with the processings finished, is transferred into the postprocessing chamber 9, similar to Embodiment 1, and is subjected to a postprocessing similar to that in Embodiment 1. Thereby, as shown by FIGS. 20(a) and 20(b), the vertical shape of the side faces of the gate electrode 15 having the polymetal structure can be retained. Although FIG. 20(b) exemplifies the case of more or less side etching, according to the postprocessing conditions, the gate electrode 15G can be formed in a state of dispensing with the side etching. After the above-described postprocessing, the semiconductor substrate 11S is taken out from the etching apparatus 1 shown in FIG. 1.

Successively, as shown in FIGS. 21(a) and 21(b), similar to Embodiment 1, after forming n⁻-type semiconductor areas 19a having a low concentration of impurity at the nMIS forming areas, p⁻-type semiconductor areas 20a having a low concentration of impurity are formed at the pMIS forming areas. Thereafter, after depositing an insulating film made of, for example, silicon nitride over the semiconductor substrate 11S by a CVD process and thereafter etching back by anisotropic etching, the side walls 21 are formed, each comprising a silicon nitride film at the gate electrode 15G and two side faces of the insulating film 28. Thereafter, as shown in FIGS. 22(a) and 22(b), similar to Embodiment 1, after forming n⁺-type semiconductor areas 19b having a high concentration of impurity at the nMIS forming areas, there are formed p⁺-type semiconductor areas 20b having a high-concentration of impurity at the pMIS forming areas. By the steps performed up to this stage, there are a substantially completed nMISQn and pMISQp, each having a source and a drain of the LDD structure.

Next, after depositing the insulating film 23a comprising, for example, a silicon oxide film over the semiconductor substrate 11S by a CVD process, the contact holes 24 are perforated in the insulating film 23a. At this time, the contact holes 24 are formed by carrying out an etching processing under an etching condition in which the silicon oxide film is made easier to etch by making an etching selection ratio of the silicon oxide film higher than that of the silicon nitride film. In this case, as shown in FIG. 22(b), although the contact hole 24 overlaps the gate electrode 15G more or less, as seen in plane view, the gate electrode 15G is not exposed owing to the side wall 21 and the insulating film 28 made of silicon nitride (that is, the contact hole 24 can be formed self-adjustingly with respect to the gate electrode 15G), and, accordingly, the integration degree of the elements can be promoted.

Thereafter, there is fabricated a system LSI having a multiple layer wiring structure similar to Embodiment 1.

An effect similar to that of Embodiment 1 can be achieved also in Embodiment 2.

Although a specific explanation has been given of the present invention based on the embodiments as described above, the invention is not limited to the embodiments, but can naturally be changed variously within a range that does not deviate from a gist thereof.

For example, although in Embodiments 1 and 2, the etching chamber for patterning the gate electrode and the postprocessing chamber are separated from each other, the invention is not limited thereto, but the etching processing and the postprocessing can be carried out in the same chamber. In this case, the postprocessing chamber is dispensed with, and, accordingly, the cost of the etching apparatus can be reduced.

Further, although in Embodiments 1 and 2, an explanation has been given of the case of applying the invention to a fabrication technology concerning the gate electrode having a SiGe layer, the invention is not limited thereto, but the invention is applicable, for example, to a fabrication technology concerning wirings having Ge compounds.

Further, although in Embodiments 1 and 2, an explanation has been given of the case of forming only elements having the same thickness of the gate insulating film ($SiO_2$ converted film thickness), the invention is not limited thereto, but the invention is applicable also to a case in which a plurality of elements having different thicknesses of gate insulating films are formed over the same semiconductor substrate. In this case, the film thickness of a gate insulating film of MIS using a relatively high power source voltage is made thicker than the film thickness of a gate insulating film of an MIS driven by a relatively low power source voltage and requiring high-speed operation.

Although in the above-described explanation, an explanation has been given of the case of applying the invention carried out by the inventors to the fabrication technology of a system LSI, which is a field of use constituting the background of the invention, the invention is not limited thereto, but the invention is applicable to a semiconductor integrated circuit device having a memory circuit of, for example, a DRAM (Dynamic Random Access Memory), a SRAM (Static Random Access Memory) or a flash memory (EEPROM; Electric Erasable and Programmable Read Only Memory), or a semiconductor integrated circuit device having a logic circuit, such as a microprocessor.

A simple explanation will be given of effects achieved by representative aspects of the invention disclosed in the application as follows.

(1) According to one of the embodiments, by patterning a gate electrode having an SiGe layer and thereafter subjecting a semiconductor substrate to plasma processing in an atmosphere of a mixed gas comprising a first gas hardly reactive to Ge and a second gas having a function of etching Si, the shape of a gate electrode having the SiGe layer can be improved.

(2) According to one of the embodiments, by patterning the gate electrode having a SiGe layer and thereafter subjecting the semiconductor substrate to plasma processing in an atmosphere of a mixed gas comprising a first gas hardly reactive to Ge and a second gas having the function of etching Si, the accuracy of dimensions of fabricating the gate electrode having the SiGe layer can be promoted.

(3) By (1) or (2), mentioned above, the yield of a semiconductor integrated circuit device having a gate electrode having a SiGe layer can be promoted.

(4) By (1) or (2), mentioned above, the performance of a semiconductor integrated circuit device having a gate electrode having a SiGe layer can be promoted.

(5) According to one of the embodiments, in a fabrication method of a semiconductor integrated circuit device having n-channel type and p-channel type field effect transistors over a semiconductor substrate, by patterning the gate electrode having a SiGe layer of the respective field effect transistor and thereafter subjecting the semiconductor substrate to plasma processing in an atmosphere of a mixed gas comprising a first gas hardly reactive to Ge and a function of etching Si, the development and fabrication time of a semiconductor integrated device having a gate electrode having a SiGe layer can be shortened.

(6) According to one of the embodiments, in the fabrication method of the semiconductor integrated circuit device having n-channel type and p-channel type field effect transistors over the semiconductor substrate, by patterning a gate electrode having a SiGe layer of the respective field effect transistor and thereafter subjecting the semiconductor substrate to a plasma processing in the atmosphere of a mixed gas comprising first gas hardly reactive to Ge and a second gas having the function of etching Si, the fabrication steps of the semiconductor integrated circuit device having a gate electrode having a SiGe layer can be simplified.

What is claimed is:

1. A semiconductor integrated circuit device comprising:
   (a) a gate insulating film formed over a main face of a semiconductor substrate; and
   (b) a gate electrode formed over the gate insulating film, wherein the semiconductor substrate has been subjected to a plasma processing in an atmosphere of a mixed gas of a first gas hardly reactive to Ge and a second gas having a function of etching Si, after forming the gate electrode,
   wherein the gate electrode includes an SiGe layer and a polycrystal silicon layer formed at a layer upward therefrom, and
   wherein a side etching amount at two side faces of the gate electrode is equal to or smaller than 40% of a length in a channel length direction of the polycrystal silicon layer constituting the gate electrode.

2. A semiconductor integrated circuit device comprising:
   (a) a gate insulating film formed over a main face of a semiconductor substrate; and
   (b) a gate electrode formed over the gate insulating film, wherein the semiconductor substrate has been subjected to a plasma processing in an atmosphere of a mixed gas of a first gas hardly reactive to Ge and a second gas having a function of etching Si,
   wherein the gate electrode includes an SiGe layer and a polycrystal silicon layer formed at a layer upward therefrom, and
   wherein a length in a channel length direction of the gate electrode at the SiGe layer, is equal to a length in the channel length direction of the polycrystal silicon layer constituting the gate electrode.

3. A semiconductor integrated circuit device comprising:
   (a) a gate insulating film formed over a main face of a semiconductor substrate; and
   (b) a gate electrode formed over the gate insulating film, wherein the semiconductor substrate has been subjected to a plasma processing in an atmosphere of a mixed gas of a first gas hardly reactive to Ge and a second gas having a function of etching Si, after forming the gate electrode,
   wherein the gate electrode includes an SiGe layer and a metal layer formed at a layer upward therefrom, and
   wherein a side etching amount at two sides faces of the gate electrode is equal to or smaller than 40% of a length in a channel length direction of the metal layer constituting the gate electrode.

4. A semiconductor integrated circuit device comprising:
   (a) a gate insulating film formed over a main face of a semiconductor substrate; and
   (b) a gate electrode formed over the gate insulating film, wherein the semiconductor substrate has been subjected to a plasma processing in an atmosphere of a mixed gas of a first gas hardly reactive to Ge and a second gas having a function of etching Si, after forming the gate electrode, and
   wherein a length in a channel length direction of the gate electrode at an SiGe layer, is equal to a length in the channel length direction of a metal layer constituting the gate electrode.

* * * * *